(12) United States Patent
Shona

(10) Patent No.: US 7,526,601 B2
(45) Date of Patent: *Apr. 28, 2009

(54) DATA REWRITING METHOD FOR FLASH MEMORY USING PARTIAL ERASES

(75) Inventor: Yoshihiro Shona, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 269 days.

This patent is subject to a terminal disclaimer.

(21) Appl. No.: 11/476,807

(22) Filed: Jun. 29, 2006

(65) Prior Publication Data

US 2006/0248269 A1 Nov. 2, 2006

Related U.S. Application Data

(62) Division of application No. 10/665,617, filed on Sep. 22, 2003, now Pat. No. 7,093,063.

(30) Foreign Application Priority Data

Dec. 17, 2002 (JP) .............. 2002-364840

(51) Int. Cl.
*G06F 12/00* (2006.01)
*G11C 11/34* (2006.01)
*G11C 16/04* (2006.01)

(52) U.S. Cl. .................. 711/103; 365/185.33

(58) Field of Classification Search ........ None
See application file for complete search history.

(56) References Cited

U.S. PATENT DOCUMENTS

| 5,341,339 | A | 8/1994 | Wells |
| 5,867,641 | A | 2/1999 | Jennett |
| 6,581,134 | B2 | 6/2003 | Rocchi et al. |
| 6,587,380 | B2 | 7/2003 | Kanai et al. |
| 2002/0031012 | A1 | 3/2002 | Chen et al. |
| 2004/0151031 | A1* | 8/2004 | Tanaka ............ 365/185.29 |

FOREIGN PATENT DOCUMENTS

| JP | 08096588 | 4/1996 |
| JP | 11-085629 | 3/1999 |
| JP | 2002334588 | 11/2002 |

* cited by examiner

*Primary Examiner*—Reginald G Bragdon
*Assistant Examiner*—Baboucarr Faal
(74) *Attorney, Agent, or Firm*—Volentine & Whitt, P.L.L.C.

(57) ABSTRACT

A data storage apparatus includes a flash memory and a control unit that controls the rewriting of data in the flash memory. The flash memory is divided into sectors, each of which is completely erasable in a time T. During a rewriting operation, multiple sectors are erased simultaneously for a time U less than T, and new data are written in a sector that has undergone multiple erasures and is now fully erased. The new data typically replace data stored in a sector that proceeds to be erased during multiple rewriting operations. The duration of each rewriting operation is reduced because the erasing process lasts for time U instead of time T.

7 Claims, 13 Drawing Sheets

DATA REWRITING METHOD FOR FLASH MEMORY USING PARTIAL ERASES

CROSS REFERENCE TO RELATED APPLICATIONS

This is a divisional application of application Ser. No. 10/665,617, filed Sep. 22, 2003, now U.S Pat. No. 7,093,063, which is hereby incorporated by reference in its entirety for all purposes.

BACKGROUND OF THE INVENTION

1. Field of the Invention

The present invention relates to a method and apparatus for rewriting data in a flash memory.

2. Description of the Related Art

Flash memory is a type of electrically erasable programmable read-only memory (EEPROM), in which the rewriting of data involves an erasing process followed by a writing or programming process. The memory cells in a flash memory are organized into small units such as bytes or words, and larger units such as pages or sectors. The erasing process is carried out on one or more pages or sectors at a time, typically by removing electrons from the floating gates of the memory cells; the writing or programming process is carried out one byte or one word at a time, typically by injecting electrons into the floating gates. In a rewriting operation, accordingly, a relatively large number of memory cells are erased simultaneously; then the writing operation is performed a few memory cells at a time within the erased group of memory cells.

The conventional erasing method applies prescribed erasing voltages continuously to the source, control gate, and drain electrodes of the memory cells in the erasing group (e.g., page or sector) for a time sufficient to erase the memory cells completely, so that the erased state can be recognized when the memory cells are read. Similarly, the conventional writing method applies prescribed writing voltages continuously to the source, control gate, and drain electrodes of the memory cells in the writing group (e.g., byte or word) for a time sufficient to program the memory cells completely, so that the programmed state can be recognized when the memory cells are read.

Whereas writing takes only a few tens of microseconds, erasing by the conventional method takes a much longer time, typically several tens of milliseconds. This erasing time is too long for a device such as a contactless smart card, which may need to rewrite data in a time frame shorter than ten milliseconds.

SUMMARY OF THE INVENTION

An object of the present invention is accordingly to rewrite data in a flash memory in less time than is possible by conventional methods.

The invention provides a data storage apparatus including a flash memory and a control unit. The flash memory is divided into sectors, each of which is completely erasable in a time T. Under the control of the control unit, a rewriting operation is performed as follows: a plurality of sectors are erased simultaneously for a time U less than the time T; new data are written in a sector that has been erased in this way a plurality of times and is now fully erased. The new data typically replace data stored in a sector that is erased over a plurality of consecutive rewriting operations, commencing with the current rewriting operation.

This rewriting operation is completed in less time than a conventional rewriting operation because the erasing time U is shorter than the conventional time T.

DETAILED DESCRIPTION OF THE INVENTION

Figure 1:
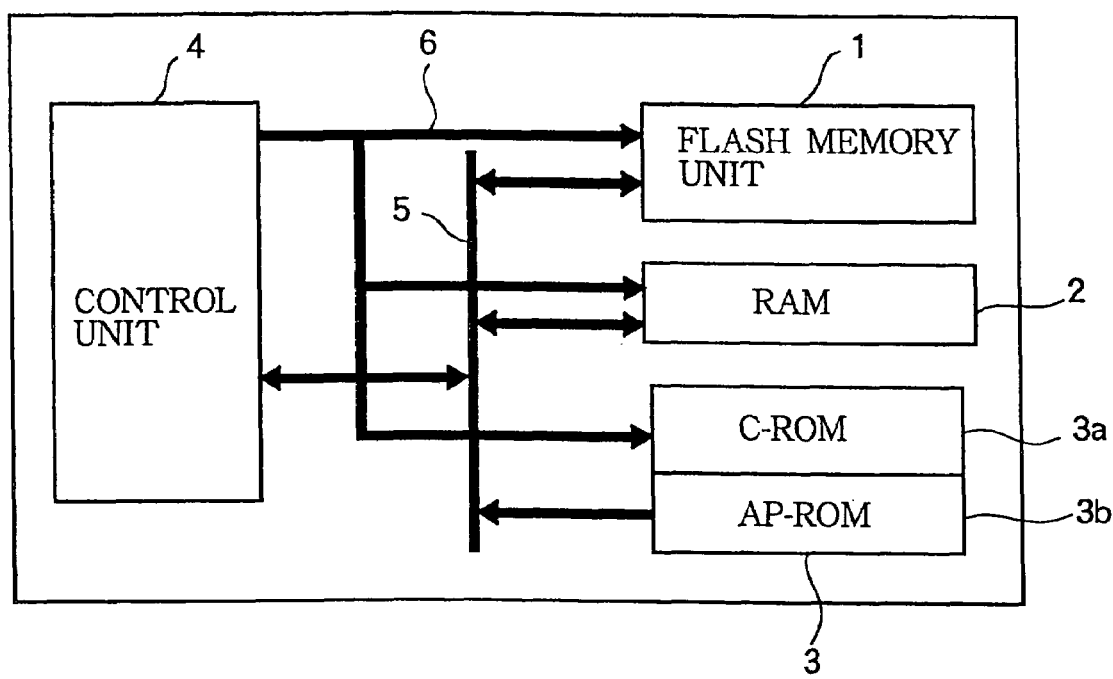
FIG. 1 is a functional block diagram of a microcomputer illustrating a first embodiment of the invention.

Embodiments of the invention will now be described with reference to the attached drawings, in which similar elements are indicated by the same reference characters.

First Embodiment

FIG. 1 is a functional block diagram of a microcomputer illustrating a first embodiment of the invention, comprising a flash memory unit 1, a random-access memory (RAM) 2, a read-only memory (ROM) 3, a control unit 4, a sixteen-bit data bus 5, and a thirteen-bit address bus 6. The ROM 3 includes a control ROM (C-ROM) 3a and an application ROM (AP-ROM) 3b. One function of these component elements is to rewrite data in the flash memory unit 1. The flash memory unit 1 may be embedded in a smart card of the contact type or the contactless type. The flash memory unit 1 and the other component elements may be integrated on a single semiconductor chip, or the flash memory unit 1 may be on a separate chip.

The flash memory unit 1 stores user data and other data semi permanently. The RAM 2 temporarily stores variables and other work data, such as data awaiting storage in the flash memory unit 1. The ROM 3 stores programs and data that control the operation of the microcomputer: the control ROM 3a stores system programs that control basic functions, such as power-on initialization and the rewriting of data in the flash memory unit 1; the application ROM 3b stores application programs. The control unit 4 executes the programs stored in the ROM 3. The data bus 5 and address bus 6 interconnect the flash memory unit 1, RAM 2, ROM 3, and control unit 4.

To rewrite data in the flash memory unit 1, an application program stored in the application ROM 3b calls on a rewrite control program stored in the control ROM 3a. The data are rewritten in the flash memory unit 1 in accordance with the rewrite control program; the application program takes no part in the control of the rewriting.

Figure 2:
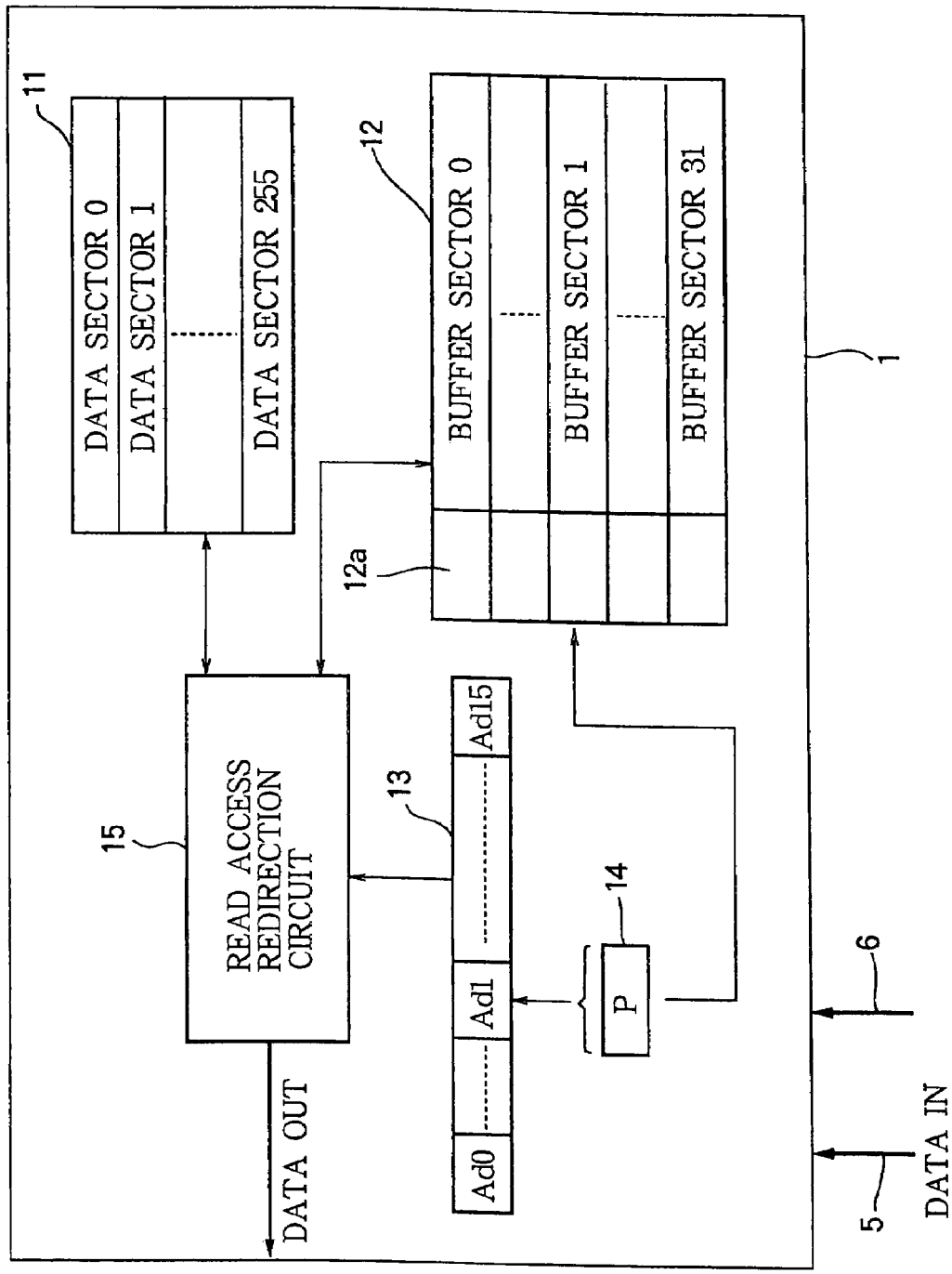
FIG. 2 is a functional bock diagram of the flash memory unit in FIG. 1.

Referring to FIG. 2, the flash memory unit 1 comprises a flash data memory 11, a flash buffer 12, an address latch 13, an address pointer (P) 14, and a read access redirection circuit 15.

The flash data memory 11 comprises two hundred fifty-six 32-byte sectors (data sectors 0 to 255) in which data can be stored.

The flash buffer 12 comprises thirty-two 34-byte sectors (buffer sectors 0 to 31). Each buffer sector comprises a 2-byte management area 12a and a 32-byte data area. The data area provides temporary storage for new data pending transfer of the data to a data sector. The management area 12a functions as a sector management means by storing the address of the data sector.

In both the flash data memory 11 and flash buffer 12, writing is carried out one word (two bytes) at a time, and erasing is carried out one or more sectors at a time. Data and buffer sectors can be erased simultaneously.

Figure 3:
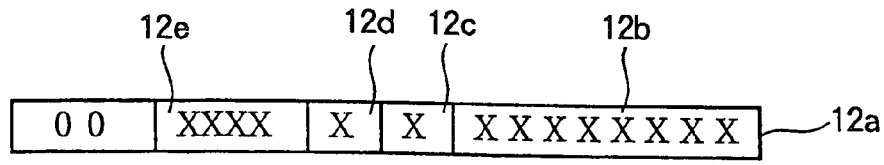
FIG. 3 shows the bit configuration of the management area of the flash buffer in FIG. 2.

FIG. 3 shows the bit configuration of the two-byte management area 12a in each buffer sector. The management area 12a comprises an 8-bit sector address area 12b (bits 7 to 0), a 1-bit validity flag 12c (bit 8), a 1-bit duplication flag 12d (bit 9), a 4-bit sector pointer 12e (bits 13 to 10), and a 2-bit reserved area (bits 14 and 15).

The sector address written in the sector address area 12b is a rewrite address indicating the destination data sector of the new data temporarily stored in the data area of the buffer sector. The validity flag 12c and the duplication flag 12d indicate whether the contents of the sector address area and data area are valid.

The address latch 13 comprises sixteen nine-bit latch areas Ad0 to Ad15. Each latch area has the same bit configuration as the nine low-order management area bits, comprising a sector address area (bits 7 to 0) and a validity flag (bit 8). The sector address area stores a data sector address; the validity flag indicates whether the data sector address is valid. All 144 bits of information in the address latch 13 are supplied in parallel to the read access redirection circuit 15. Like the management areas of the buffer sectors, the address latch 13 functions as a sector management means.

The address pointer 14 is a five-bit counter. The four low-order bits (bits 0 to 3) indicate the position of a latch area in the address latch 13, and the whole five-bit value indicates the position of a buffer sector in the flash buffer 12.

Figure 4:
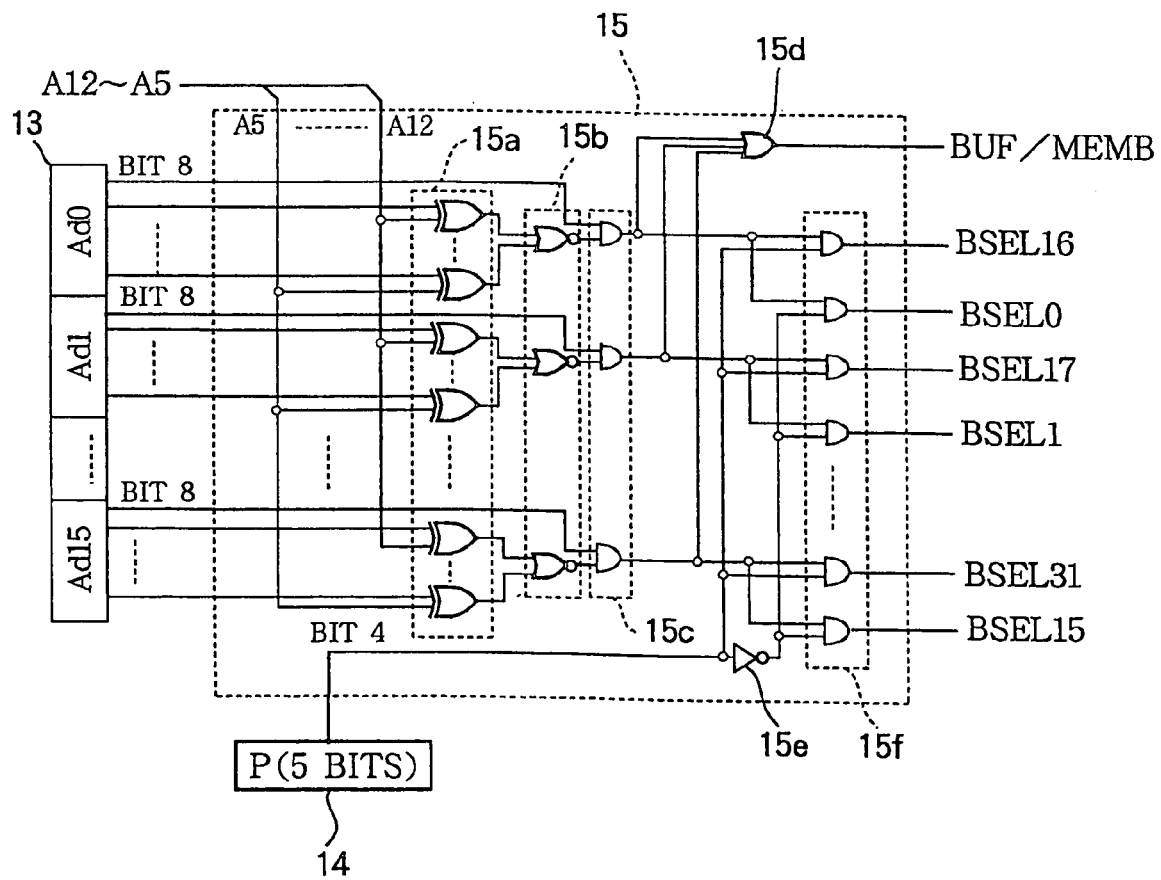
FIG. 4 shows an exemplary configuration of the read access redirection circuit in FIG. 2.

FIG. 4 shows an exemplary circuit configuration of the read access redirection circuit 15, comprising one hundred twenty-eight (8×16) XOR gates 15a, sixteen NOR gates 15b, sixteen AND gates 15c, one OR gate 15d, one inverter that is referred to below as an INV gate 15e, and thirty-two AND gates 15f.

The read access redirection circuit 15 in this example receives the eight high-order bits (A5 to A12), representing a sector address, from the thirteen-bit address bus 6. The read access redirection circuit 15 also receives the output from each latch area Adx (x=0 to 15) in the address latch 13, including both the data sector address stored in the eight low-order bits (bits 7 to 0) and the validity flag stored in the high-order bit (bit 8).

Each XOR gate 15a compares one data sector address bit (bit y, where y is any number from 0 to 7) output from a latch area Adx with the corresponding bit A(y+5) of the input address to test whether the two bits match. The outputs from the eight XOR gates connected to latch area Adx are supplied to the (x+1)-th NOR gate 15b. The output of this NOR gate 15b is supplied to the (x+1)-th AND gate 15c together with the validity flag (bit 8) from latch area Adx. The outputs from the sixteen AND gates 15c are supplied to the OR gate 15d, which outputs the ORed result as a selector signal BUF/MEMB, selecting either the flash data memory 11 or flash buffer 12.

The INV gate 15e receives the most significant count bit (bit 4) from the address pointer 14 and outputs a signal complementary to this bit.

The (2x+1)-th AND gate 15f receives the output of the (x+1)-th AND gate 15c and the most significant count bit from the address pointer 14, and outputs an ANDed signal as a selection signal BSEL(x+16) for the (x+16)-th buffer sector. The (2x+2)-th AND gate 15f receives the output of the (x+1)-th AND gate 15c and the output of the INV gate 15e, and outputs an ANDed signal as a selection signal BSELx for the x-th buffer sector.

The flash memory unit 1 is specified as providing storage space for eight kilobytes (8 kbytes) of data. This is the capacity of the two hundred fifty-six 32-byte data sectors in the flash data memory 11. The thirty-two 32-byte data areas in the flash buffer 12, however, give the flash memory unit 1 a total storage capacity equivalent to two hundred eighty-eight data sectors. That is, the flash memory unit 1 has thirty-two sectors in excess of its specified data capacity of 8 kbytes.

A typical rewriting operation in the first embodiment involves the writing of new data into a buffer sector, the transfer of data from another buffer sector to a data sector, and the erasing of a plurality of buffer and data sectors. Since data are written a word (two bytes) at a time, a typical rewriting operation includes sixteen word writing operations on a single 32-byte data sector and seventeen word writing operations on a single 34-byte buffer sector. If necessary, another word writing operation may be performed to set the duplication flag in another buffer sector.

The erasing part of the rewriting operation is a partial erasure that lasts for a time U that is shorter than the time T required for complete data erasure, but is equal to or greater than $\frac{1}{16}$ of that time ($T/16 \leq U < T$). A single sector is fully erased by sixteen of these partial erasures, spread over sixteen rewriting operations.

In the rewriting operation in the first embodiment, an application program in the application ROM 3b calls a rewriting subroutine (or rewrite control program) from the control ROM 3a, and the control unit 4 controls the operation in accordance with the rewriting subroutine. The rewriting operation will now be described in further detail.

FIGS. 5 to 9 show the states of the flash data memory 11, flash buffer 12, address latch 13, and address pointer 14 after the first, second, sixteenth, seventeenth, and thirty-second in a series of rewriting operations performed in accordance with the first embodiment. In these drawings and the subsequent description, "0" means that the corresponding memory cell of the flash data memory 11 or flash buffer 12 has been erased, and "1" means that the memory cell has been programmed by writing "1" data. It will be assumed that each rewriting operation in the series is directed toward a different sector address, and that buffer sector 0 has been fully erased before the first rewriting operation starts. Buffer sectors 1 to 15 are assumed to be in various stages of partial erasure. The data in buffer sectors 16 to 31 are assumed to be invalid.

Figure 5:
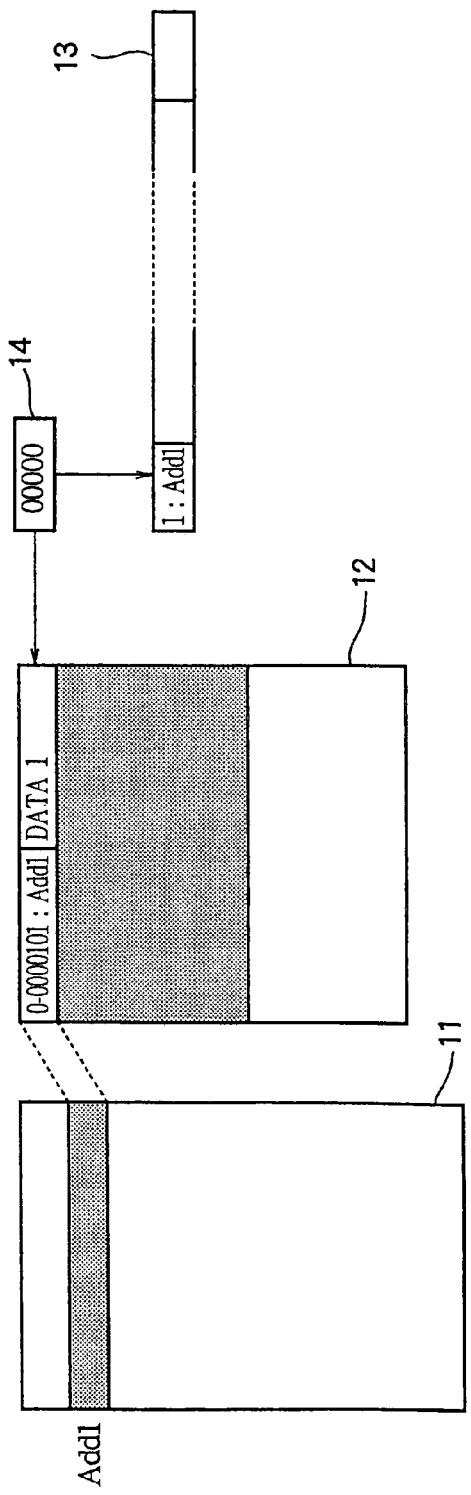
FIGS. 5, 6, 7, 8, and 9 show states of the flash data memory, flash buffer, address latch, and address pointer in FIG. 2 during a series of rewriting operations.

In the first rewriting operation illustrated in FIG. 5, the value in the address pointer 14 is "00000", which points at buffer sector 0. New data (Data1) are written in the data area of buffer sector 0. In the management area of buffer sector 0, a first rewrite address Add1 (the address of the data sector to which Data1 will eventually be transferred) is written in bits 7 to 0; the validity flag in bit 8 is set to "1"; the duplication flag in bit 9 is left cleared to "0"; and "0001" is written as a sector pointer in bits 13 to 10.

In the latch area Ad0 indicated by the four low-order bits ("0000") of the address pointer 14, the first rewrite address Add1 is written in bits 7 to 0, and the validity flag in bit 8 is set to "1".

Following this writing process, an erasing process is carried out on the data sector specified by rewrite address Add1 and buffer sectors 1 to 16 (the sixteen buffer sectors following the buffer sector currently pointed at by the address pointer). These seventeen sectors are erased for the time U described above (T/16≦U<T, where T is the conventional time required to erase a sector completely. The erasing process in indicated by shading in the drawing.

For buffer sector 16 and the data sector specified by rewrite address Add1, this erasing process is the first in a series of sixteen erasing processes that will be carried out. These two sectors are only partially erased, because the erasure time U is shorter than the conventional erasure time T. For buffer sector 1, this erasing process is the last in a similar series of sixteen erasing processes; the erasing of buffer sector 1 is completed with this erasing process.

Figure 6:
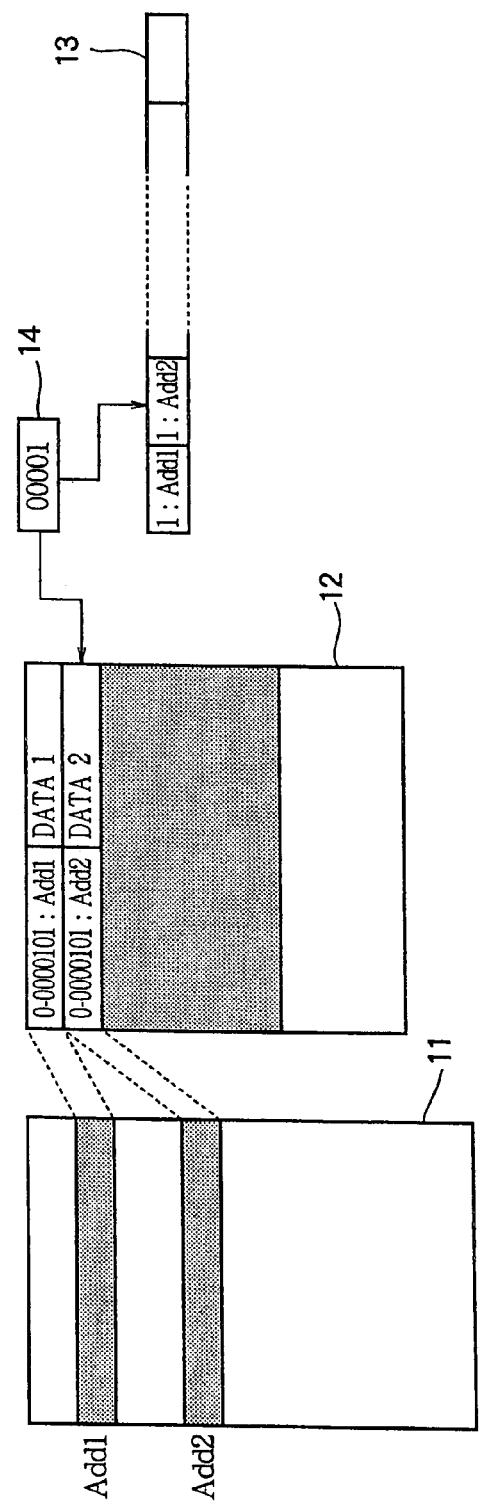

In the second rewriting operation illustrated in FIG. 6, the address pointer 14 is incremented to "00001", which points at buffer sector 1. New data Data2 are written in the data area of buffer sector 1. In the management area of buffer sector 1, a second rewrite address Add2 (the address of the data sector to which Data2 will eventually by transferred) is written in bits 7 to 0; the validity flag in bit 8 is set to "1"; the duplication flag in bit 9 is left cleared to "0"; and "0001" is written as a sector pointer in bits 13 to 10.

In the latch area Ad1 indicated by the four low-order bits "0001" of the address pointer 14, the second rewrite address Add2 is written in bits 7 to 0, and the validity flag in bit 8 is set to "1".

Following this writing process, an erasing process is carried out for the time U on the data sectors specified by rewrite addresses Add1 and Add2 and on buffer sectors 2 to 17 (the sixteen buffer sectors following the buffer sector currently pointed at by the address pointer). For buffer sector 17 and the data sector specified by rewrite address Add2, this erasing process is the first in a series of sixteen erasing processes that will be carried out. For buffer sector 16 and the data sector specified by rewrite address Add1, this erasing process is the second in the series of sixteen erasing processes begun in the first rewriting operation. This erasing process also completes the erasure of buffer sector 2.

In the third to fifteenth rewriting operations, the address pointer 14 is incremented by one each time, to "00010", "00011", . . . , "01110", pointing successively at buffer sectors 2 to 14. New data (Data3 to Data15) are written in the data areas of these buffer sectors. Corresponding rewrite addresses Add3 to Add15 are written in the management areas of the buffer sectors, the validity flags in these management areas are set to "1", the duplication flags are left cleared to "0", and "0001" is written as a sector pointer.

The rewrite addresses Add3 to Add15 and the validity flag ("1") are also written in the latch areas Ad2 to Ad14 indicated by the four low-order address pointer bits "0010", "0011", . . . , "1110".

Following this writing process, an erasing process is carried out on the data sectors specified by the rewrite addresses written in the management areas of the buffer sectors up to and including the buffer sector currently pointed at by the address pointer, and on the sixteen buffer sectors following this buffer sector.

Figure 7:
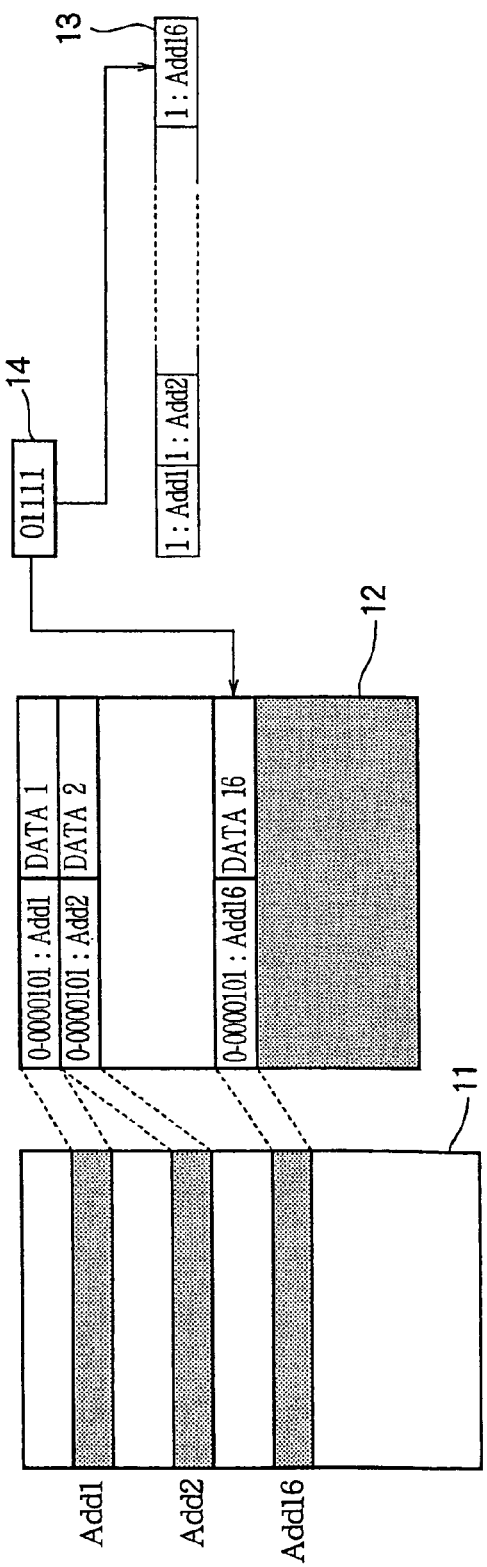

In the sixteenth rewriting operation illustrated in FIG. 7, the address pointer 14 is incremented to "01111", which points at buffer sector 15. New data Data16 are written in the data area of buffer sector 15. In the management area of buffer sector 15, a sixteenth rewrite address Add16 (the address of the data sector to which Data16 will eventually be transferred) is written in bits 7 to 0; the validity flag in bit 8 is set to "1"; the duplication flag in bit 9 is left cleared to "0"; and "0001" is written as a sector pointer in bits 13 to 10.

In the latch area Ad15 indicated by the four low-order bits "1111" of the address pointer 14, the sixteenth rewrite address Add16 is written in bits 7 to 0, and the validity flag in bit 8 is set to "1".

Following this writing process, an erasing process is carried out on the sixteen data sectors specified by rewrite addresses Add1 to Add16 and on buffer sectors 16 to 31 (the sixteen buffer sectors following the buffer sector currently pointed at by the address pointer). These thirty-two sectors are erased for the same length of time U as in the preceding rewriting operations.

At the end of these sixteen rewriting operations, the address latch 13 is full and the flash buffer 12 is half full; that is, validity flags are set in all of the latch areas and half of the buffer sectors. The erasing process carried out in the sixteenth rewriting operation is the first of the series of sixteen erasing processes that will be carried out on buffer sector 31 and the data sector specified by rewrite address Add16. This erasing process is also the sixteenth in the series of erasing processes carried out on buffer sector 16 and the data sector specified by rewrite address Add1, the erasure of which is now complete.

Figure 8:
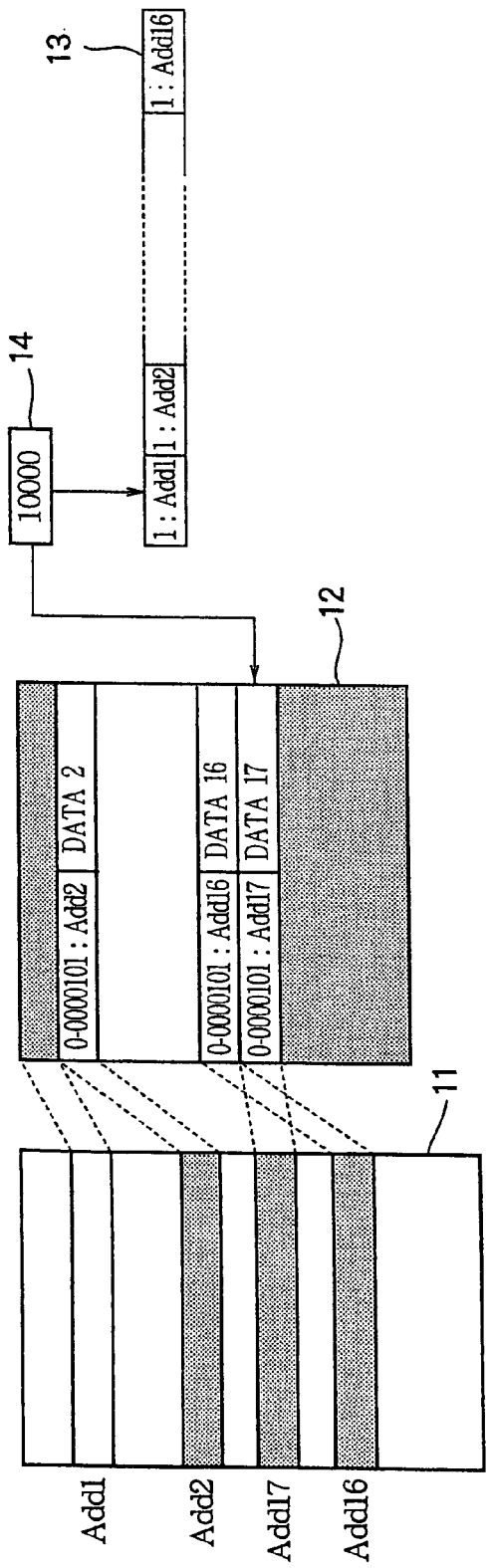

In the seventeenth rewriting operation illustrated in FIG. 8, the address pointer 14 is incremented to "10000", which points at buffer sector 16. The four low-order bits "0000" of the address pointer 14 indicate latch area Ad0 in the address latch 13, which was also indicated in the first rewriting operation. Because the validity flag in latch area Ad0 is now set to "1", the data (Data1) temporarily stored in buffer sector 0 are transferred (copied) to the data sector indicated by the rewrite address Add1 in latch area Ad0. (In the first to sixteenth rewriting operations, the data in the data areas of buffer sectors 16 to 30 were not transferred to data sectors because the corresponding validity flags had not been set to "1".)

Following the transfer of Data1, new data Data17 are written in the data area of buffer sector 16, which is pointed at by the address pointer 14. In the management area of buffer sector 16, the seventeenth rewrite address Add17 (the address of the data sector to which Data17 will eventually be transferred) is written in bits 7 to 0; the validity flag in bit 8 is set to "1"; the duplication flag in bit 9 is left cleared to "0", and "0001" is written as a sector pointer in bits 13 to 10.

Next, the information in the latch area Ad0 indicated by the four low-order bits of the address pointer 14 is changed. Specifically, the seventeenth rewrite address Add17 is written in bits 7 to 0, replacing the first rewrite address Add1. The validity flag in bit 8 remains set to "1".

After these writing processes, an erasing process is carried out on the sixteen data sectors specified by rewrite addresses Add2 to Add17 and buffer sectors 0 and 17 to 31 (the sixteen buffer sectors following the buffer sector currently pointed at by the address pointer). These thirty-two sectors are erased for the time U described above. The erasing process carried out in the seventeenth rewriting operation is the first in the series of sixteen erasing processes that will be carried out on buffer sector 0 and the data sector specified by rewrite address Add17. This erasing process is also the sixteenth in the series of erasing processes carried out on buffer sector 17 and the data sector specified by rewrite address Add2, which are now fully erased.

In the eighteenth to thirty-first rewriting operations, the address pointer 14 is incremented by one each time, to "10001", "10010", ..., "11110", pointing successively at buffer sectors 17 to 30. The four low-order bits "0001", "0010", ..., "1110" indicate latch areas Ad1 to Ad14 in the address latch 13, as in the second to fifteenth rewriting operations. Because the validity flags in latch areas Ad1 to Ad14 have been set to "1", the data temporarily stored in buffer sectors 1 to 14 (Data2 to Data15) are transferred to the data sectors specified by the rewrite addresses (Add2 to Add15) in the corresponding latch areas.

In the eighteenth to thirty-first rewriting operations, new data Data18 to Data31 are written in the data areas of buffer sectors 17 to 30, which are successively pointed at by the address pointer 14. The eighteenth to thirty-first rewrite addresses Add18 to Add31, a "1" validity flag, a "0" duplication flag, and a "0001" sector pointer are written in the management areas of buffer sectors 17 to 30.

As Data2 to Data15 are transferred to the corresponding data sectors, the contents of the latch areas Ad1 to Ad14 indicated by the four low-order bits of the address pointer 14 are altered: the second to fifteenth rewrite addresses Add2 to Add15 are successively replaced by the eighteenth to thirty-first rewrite addresses Add18 to Add31. The validity flags remain set to "1".

Following these writing processes, an erasing process is carried out on the sixteen data sectors specified by the rewrite addresses held in the address latch 13 and on the sixteen buffer sectors following the buffer sector currently pointed at by the address pointer.

Figure 9:
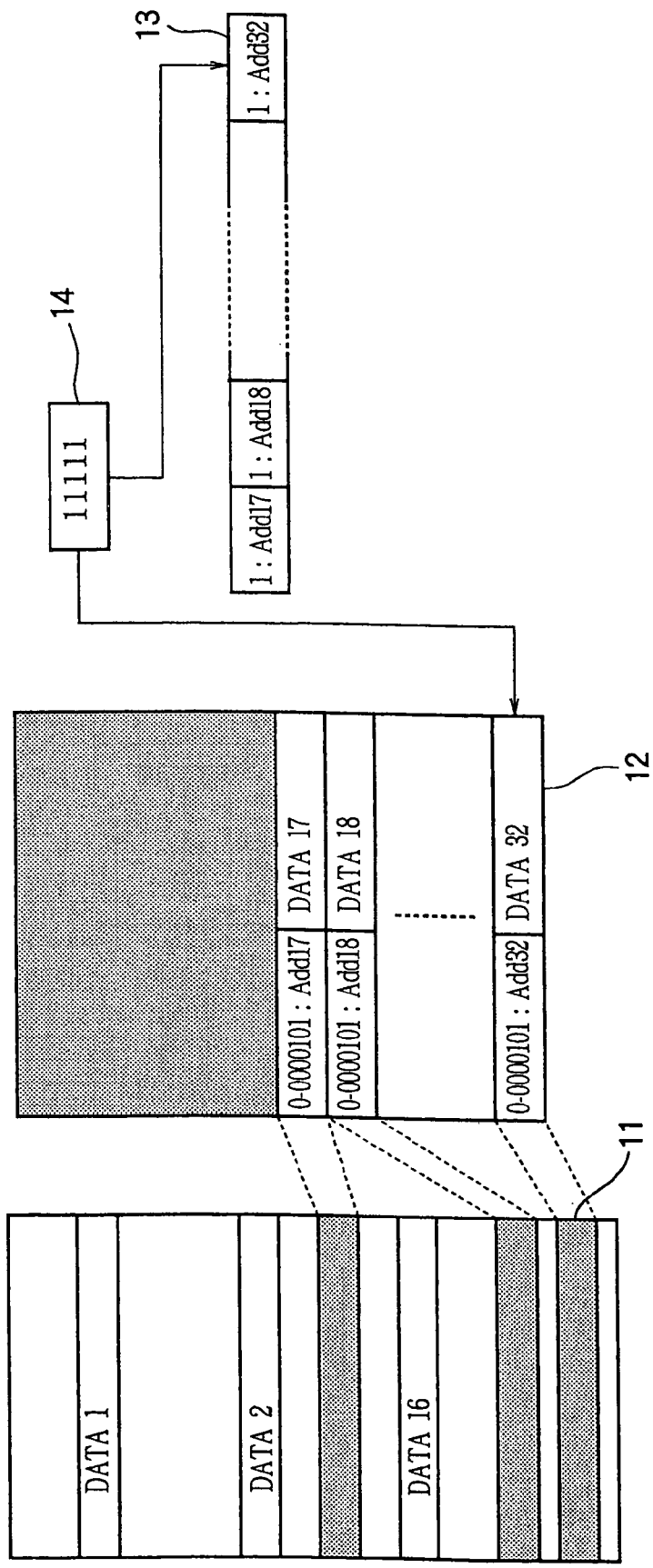

In the thirty-second rewriting operation illustrated in FIG. 9, the address pointer 14 is incremented to "11111", which points at buffer sector 31. The four low-order bits "1111" of the address pointer 14 indicate latch area Ad15 in the address latch 13, as in the sixteenth rewriting operation. Because the validity flag in latch area Ad15 has been set to "1", the data Data16 temporarily stored in buffer sector 15 are transferred to the data sector specified by the sixteenth rewrite address Add16, which is held in latch area Ad15 and in the management area of buffer sector 15.

In the thirty-second rewriting operation, new data Data32 are written in the data area of buffer sector 31, which is pointed at by the address pointer 14. A thirty-second rewrite address Add32, a "1" validity flag, a "0" duplication flag, and a "0001" sector pointer are written in the management area of buffer sector 31. The rewrite address Add32 is also written in the latch area Ad15 indicated by the four low-order bits of the address pointer 14, replacing the sixteenth rewrite address Add16. The validity flag in latch area Ad15 remains set to "1".

Following these writing processes, an erasing process is carried out on the sixteen data sectors specified by rewrite addresses Add17 to Add32 and on buffer sectors 0 to 15 (the sixteen buffer sectors following the buffer sector currently pointed at by the address pointer). The erasure time for these thirty-two sectors is the same time U as in the preceding rewriting operations.

At the end of the thirty-second rewriting operation, both the flash buffer 12 and the address latch 13 are full (although half of the buffer sectors are partly or completely erased). The erasing process carried out in the thirty-second rewriting operation is the first of a series of sixteen erasing processes that will be carried out on the data sector specified by rewrite address Add32, and is the first of a new series of sixteen erasing processes that will be carried out on buffer sector 15. This erasing process is also the sixteenth in the series of erasing processes carried out on buffer sector 0 and the data sector specified by rewrite address Add17, which are now fully erased.

The thirty-third rewriting operation is the same as the first rewriting operation, except that this time temporarily stored data are transferred from buffer sector 16 to the corresponding data sector. The thirty-fourth and subsequent rewriting operations are similar repetitions of the operations illustrated in FIGS. 6 to 9. As the rewriting operations are repeated, data sectors and buffer sectors are sequentially erased. New data are temporarily stored in an erased buffer sector, and then transferred to the appropriate data sector after that data sector has been erased.

In the sector pointer written in bits 13 to 10 of the management area of a buffer sector, the bit set to "1" is shifted to the left once every thirty-two rewriting operations. For instance, "0010" is written as a sector pointer in the thirty-third to sixty-fourth rewriting operations, and "0100" in the sixty-fifth and ninety-sixth rewriting operations. This shift of the "1" bit position may be used to identify erasure errors; a sector pointer with two bits set to "1" is evidence of a buffer sector that was written to before being completely erased.

Figure 10:
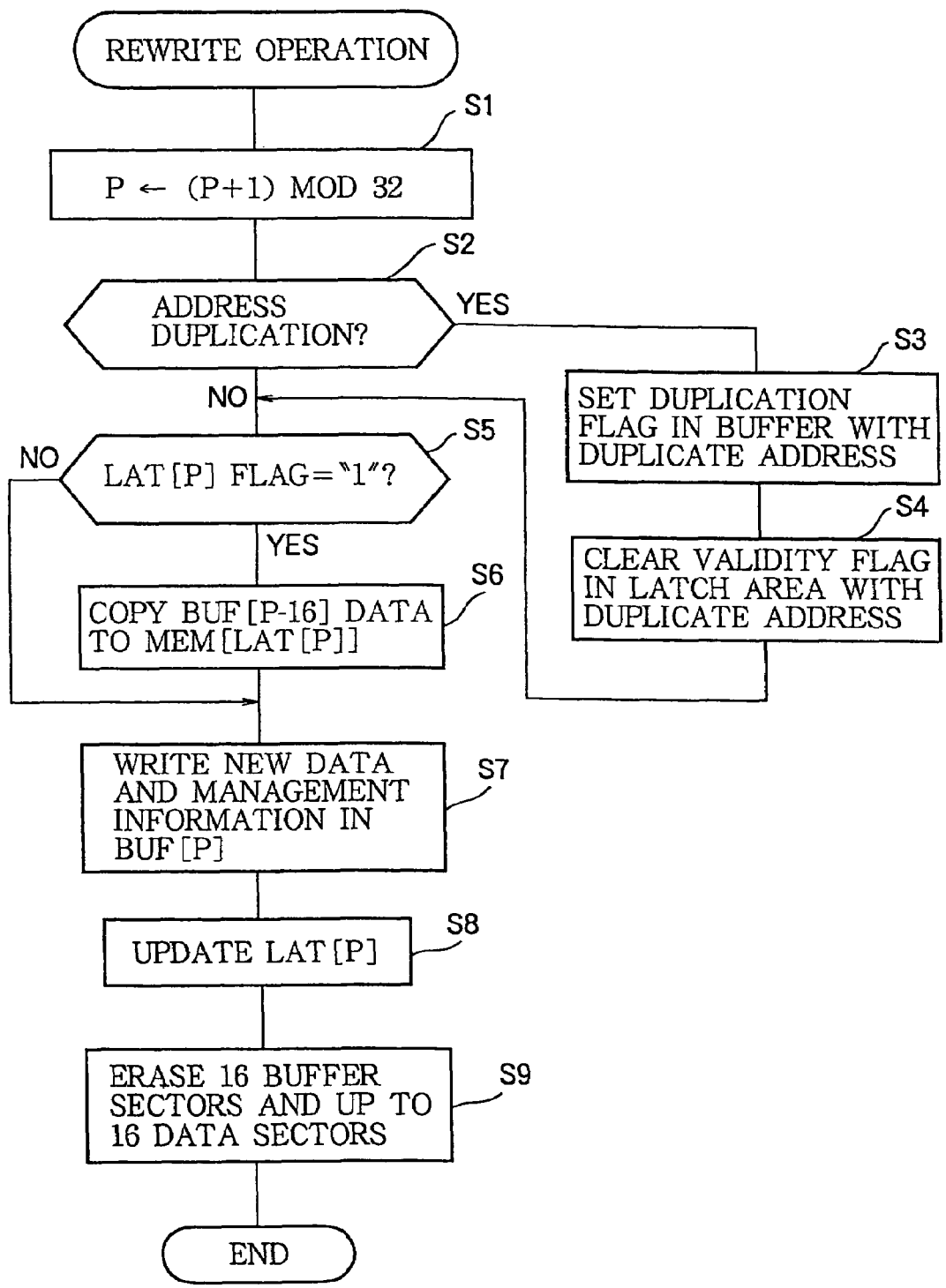
FIG. 10 is a flowchart illustrating the rewriting operation in the first embodiment.

FIG. 10 is a flowchart illustrating the rewriting operation in the first embodiment of the invention. In this drawing and the subsequent description, P represents the value of the address pointer 14, and LAT[P] represents the latch area in the address latch 13 indicated by the four low-order bits of the pointer value P.

BUF[P], BUF[P−16], BUF[P+1], and BUF[P+16] represent buffer sectors indicated by P, P−16, P+1, and P+16, respectively. Because the thirty-two buffer sectors are used cyclically, both P−16 and P+16 are equal to the remainder left when P+16 is divided by 32, which can be expressed as follows.

(P+16) mod 32

Similarly, P+1 is equal to the remainder left when P+1 is divided by 32, which can be expressed as follows.

(P+1) mod 32

MEM[LAT[P]] represents the data sector specified by the rewrite address written in latch area LAT[P]. At the beginning of the rewriting operation, this is the data sector address stored in buffer sector BUF[P−16].

Step S1: Pointer P is incremented by 1 modulo 32 as explained above. The new value is:

(P+1) mod 32

Step S2: The address latch 13 is checked to see whether any rewrite address already stored therein matches the current rewrite address. If so, step S3 is carried out next. If not, step S5 is carried out next.

Step S3: The duplication flag (bit 9) in the management area of the buffer sector having the duplicate rewrite address is set to "1".

Step S4: The validity flag (bit 8) in the latch area having the duplicate rewrite address is cleared to "0".

Step S5: The validity flag in bit 8 of latch area LAT[P] is checked. If this validity flag is "1", indicating that the rewrite address in latch area LAT[P] is valid, step S6 is carried out next. Otherwise, step S7 is carried out next.

Step S6: The valid data temporarily stored in buffer sector BUF[P−16] are copied into data sector MEM[LAT[P]] a word at a time.

Step S7: The new data are written into the data area of buffer sector BUF[P], and the current rewrite address and a "1" validity flag are written into the management area of buffer sector BUF[P], a word at a time.

Step S8: The current rewrite address and a "1" validity flag are written into latch area LAT[P].

Step S9: An erasing process is carried out simultaneously on the sixteen buffer sectors from BUF[P+1] to BUF[P+16] and on the data sectors among the sixteen data sectors from MEM[LAT[P−15]] to MEM[LAT[P]] specified by valid rewrite addresses (rewrite addresses having validity flags set to "1" in the corresponding latch areas).

Steps S3 and S4 are performed to ensure that, when data destined for the same data sector are stored in two or more buffer sectors simultaneously, only the newest data are actually transferred to the data sector. In step S3, the duplication flag in the management area of the buffer sector is set to "1" without resetting the validity flag to "0" because resetting the validity flag would require the whole buffer sector to be erased, which would take a long time.

In step S5, latch area LAT[P] has not yet been updated and contains the rewrite address and validity flag corresponding to the data written in the management area of buffer sector BUF[P−16]. The validity flag indicates whether buffer sector BUF[P−16] has valid data to be copied into data sector MEM[LAT[P]]. If the validity flag is set to "1", the data are valid and must be copied in step S6. If the validity flag is cleared to "0", the data are invalid, either because they have been supplanted by newer data or because buffer sector BUF[P−16] has not yet been used yet; in either case, the data must not be copied.

Because data are written a word at a time, sixteen writing processes are carried out to copy the data in step S6. If writing one word is assumed to take twenty microseconds (20 μs), the copying is completed in 320 μs.

In step S7, seventeen word writing processes are carried out, which takes 340 μs under the same assumption.

In the rewriting operation in the first embodiment, the address pointer 14 and the rewrite addresses in the address latch 13 are decoded to select multiple buffer and data sectors, so that the erasing process can be carried out on multiple data sectors and multiple buffer sectors simultaneously.

Each sector is erased by sixteen erasing processes, each of which is carried out in a different rewriting operation. Accordingly, the erasure time in step S9 can be approximately 1/16 of the conventional erasure time. If it takes twenty milliseconds (20 ms) to erase a sector completely, the erasure time in step S9 may be approximately 1.25 ms.

When step S9 ends, a single rewriting operation has been completed. The duration of a single rewriting operation, excluding software processing time, depends on whether there is a duplicate rewrite address. If there is no duplicate rewrite address, under the writing and erasing times assumed above, the duration is $$0.32+0.34+1.25=1.91 \text{ ms}$$

When a duplicate rewrite address is found, one additional writing process is required to set the duplication flag in the relevant management area, but the duration of the rewriting operation still does not exceed 2 ms.

Initialization at power-on will now be described. The address latch 13 and address pointer 14 are volatile storage devices that lose data when power is turned off. Accordingly, the address latch 13 and address pointer 14 have to be initialized at power-on, to restore the information lost at power-off. The address latch 13 must be initialized with the addresses of the data sectors currently awaiting data transfer. These addresses can be copied from the management areas 12*a* of the corresponding buffer sectors. The address pointer 14 must be initialized to point at the last buffer sector in which new data were written before the last power-off. This buffer sector can be identified from the sector pointers written in the management areas 12*a*. Since the flash buffer 12 comprises flash memory, the contents of the management areas 12*a* are not lost when power is turned off.

The first step in the initialization process is to identify the position of the last buffer sector used to store new data before the last power-off. This buffer and the fifteen preceding buffer sectors still store non-erased data, so their management areas still store the sector pointers that were written together with the data. The next buffer sector, which is the first buffer sector that will be used for storing new data after power-on, has been fully erased, so its sector pointer currently reads zero ("0000"). The next fifteen buffer sectors have been partly erased; their sector points may or may not read zero, depending on how far the erasing has proceeded.

As noted above, the bit set to "1" in the sector pointers is shifted to the left once every thirty-two rewriting operations. The sector pointer value written in the buffer sector indicated by the address pointer 14 is "0001" during the first thirty-two rewrite operations, "0010" during the next thirty-two rewrite operations, "0100" during the next thirty-two rewrite operations, "1000" during the next thirty-two rewrite operations, then "0001" during the next thirty-two rewrite operations and so on. Each written sector pointer value is retained for sixteen rewrite operations, then gradually erased to zero over the next sixteen rewrite operations.

At power-on, accordingly, the management areas 12*a* of the buffer sectors are searched in order from buffer sector 0 to buffer sector 31 to find the first sector pointer that is not "0000". From the point at which this first non-zero sector pointer is found, the search continues in the same direction to find the first buffer sector with a zero ("0000") sector pointer. If necessary, the search may continue from buffer sector 31 to buffer sector 0. The first buffer sector having a zero sector pointer is the fully erased buffer sector in which the first new data will be written after power-on. The address pointer 14 is initialized to the buffer sector number of the preceding buffer sector (the last buffer sector having a non-zero sector pointer), which stores the last new data written before the last power-off.

Next, the nine low-order bits (the rewrite address in bits 7 to 0 and the validity flag in bit 8) of the management area 12*a* of the buffer sector pointed at by the initialized address pointer 14 are copied into the latch area indicated by the four low-order bits of the address pointer 14. Similarly, the nine low-order bits of the management areas 12*a* of the fifteen preceding buffer sectors are copied into the corresponding latch areas. If the value of the initialized address pointer is P, these buffer sectors have sector numbers from P−1 to P−15 (modulo 32), and the corresponding latch areas are Adx, where x=P−1 to P−15 (modulo 16). This completes the initialization of the address latch 13 and address pointer 14 at power-on.

This initialization procedure can be provided as a subroutine in the control ROM 3a. An application program in the application ROM 3b can call the initialization subroutine in the control ROM 3a, and the control unit 4 can control the initialization operation according to the initialization subroutine.

The data reading process will be described next. While the address of a data sector is held in the address latch 13, the data sector is being erased, and its data must be read from the corresponding buffer sector. Therefore, as the first step in the data reading process, the read access redirection circuit 15 checks whether the sector address of the data to be read (referred to below as the read sector address) matches any rewrite address written in the address latch 13.

This check is performed very quickly by the read access redirection circuit 15 in FIG. 4. XOR gates 15a compare the eight bits (bits 7 to 0) of the rewrite address output from each latch area Adx of the address latch 13 with the corresponding bits A12 to A5 of the read sector address. If all bits match, the output of the (x+1)-th NOR gate 15b goes high.

The validity flag (bit 8) output from latch area Adx is "0" (low) when the rewrite address and data stored in the corresponding buffer sector are invalid, that is, when the buffer sector is not yet in use, or stores data that have been supplanted by newer data with the same rewrite address. The validity flag is "1" (high) when the rewrite address and data in the buffer sector are valid, that is, when the buffer sector stores data that have not been supplanted and have not yet been copied to a data sector.

If the read sector address matches the rewrite address in latch area Adx and if this rewrite address is valid, the output of the (x+1)-th AND gate 15c goes high.

The outputs of the first to sixteenth AND gates 15c are supplied to the OR gate 15d. If the output of one of the AND gates 15c is high, the selector signal BUF/MEMB output from the OR gate 15d goes high, indicating that the data must be read from the buffer sector. If all of the outputs of the AND gates 15c are low, the selector signal BUF/MEMB goes low, indicating that the data must be read from the data sector.

The output of the (x+1)-th AND gate 15c is also supplied to the (2x+1)-th and (2x+2)-th AND gates 15f. The (2x+1)-th AND gate 15f also receives the most significant bit (bit 4) of the address pointer 14, and generates a selection signal BSEL (x+16) for the (x+16)-th buffer sector. The (2x+2)-th AND gate 15f receives the inverse of the most significant bit (bit 4) of the address pointer 14 (output from the INV gate 15e), and generates a selection signal BSELx for buffer sector x.

If the read sector address matches any rewrite address in the address latch 13, it will match at most one rewrite address having a validity flag set to "1". If such a match occurs, the selector signal BUF/MEMB goes high, and one of buffer sector selection signals BSEL0 to BSEL31 goes high, indicating the flash buffer sector in the flash buffer 12 from which the data should be read.

If the read sector address does not mach any valid rewrite address in the address latch 13, the selector signal BUF/MEMB goes low, indicating that the data should be read from the flash data memory 11. The data are read from the data sector indicated by the read sector address.

In the rewriting operation in the first embodiment, new data and their destination data sector address are temporarily stored in a buffer sector; the destination data sector is erased by sixteen comparatively short erasing processes spread over sixteen rewriting operations; then, after the data sector has been fully erased, the new data are moved from the buffer sector to the data sector. Each rewriting operation is therefore completed in a fraction of the time that would be required for a conventional rewriting operation involving the complete erasure of a data sector.

Since the read access redirection circuit 15 controls the reading of data from data sectors and buffer sectors, application programs do not have to keep track of buffered data or search for matching sector addresses. Therefore, the data read time can be reduced.

Because a sector is erased by a series of short erasing processes, performed in separate rewriting operations, backup power for a long erasing process is not necessary.

If data destined for the same data sector are received two or more times during sixteen consecutive rewriting operations, only the newest data are transferred to the data sector. Accordingly, the number of write operations to the flash data memory 11 can be reduced.

Second Embodiment

The rewriting operation in the second embodiment is a variation of the rewriting operation in the first embodiment.

In the rewriting operation in the first embodiment, if a duplicate address is detected (step S2 in FIG. 10), the duplication flag in the management area 12a of the buffer sector having the duplicate address is set to "1" (step S3), flagging the rewrite address and the old data in that buffer sector as invalid, before the new data and rewrite address have been written in the current buffer sector. If power fails or is shut down during steps S4 to S7, it may therefore become impossible to recover either the new data or the old data. In the rewriting operation of the second embodiment, the duplication flag is not set to "1" until after the new data have been written in the current buffer sector, so that at all times, either the old data or the new data are flagged as valid in the flash buffer 12. Valid data can therefore be found in the initialization at the next power-on even if power fails or is shut down while the new data are being written in the current buffer sector.

A microcomputer illustrating the second embodiment of the invention has the same configuration as the microcomputer illustrating the first embodiment (FIGS. 1 and 2). A repeated description will be omitted.

Figure 11:
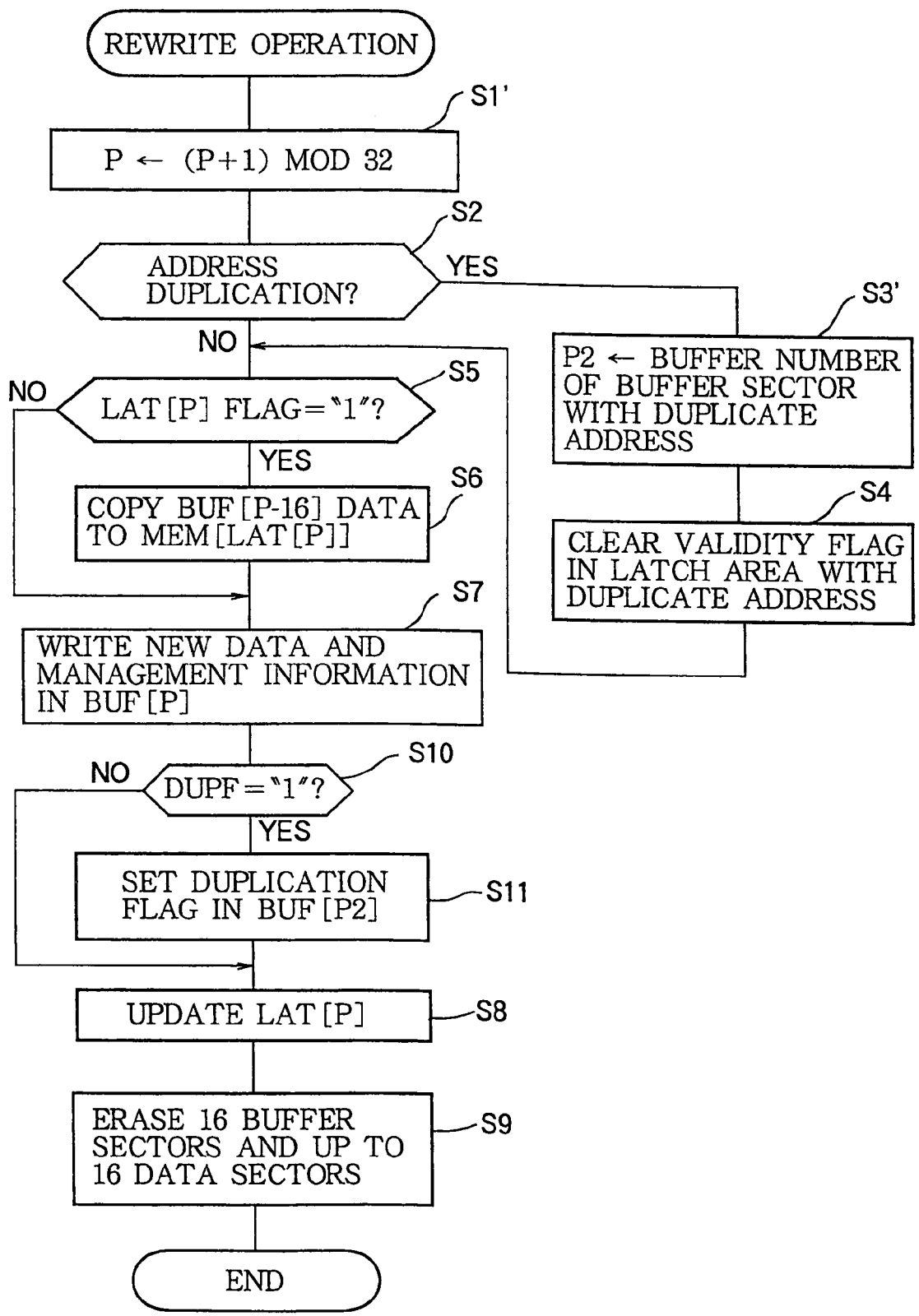
FIG. 11 is a flowchart illustrating the rewriting operation in a second embodiment.

FIG. 11 is a flowchart illustrating the rewriting operation in the second embodiment of the invention. Steps equivalent to steps shown in FIG. 10 are indicated by identical reference characters.

In FIG. 11 and the following description, DUPF and P2 are variables located in the RAM 2. DUPF is a duplication detection flag indicating the presence or absence of a duplicate address. DUPF is set to "1" when a duplicate address is detected in a rewriting operation, and reset to "0" when a duplicate address is not detected. When a duplicate rewrite address is detected, P2 is used to store the buffer sector number of the buffer sector having the duplicate rewrite address; this buffer sector is denoted BUF[P2] in FIG. 11.

Compared with the rewriting operation in the first embodiment, the rewriting operation in the second embodiment inserts two additional steps (steps S10 and S11) between steps S7 and S8, and modifies steps S1 and S3. The modified steps are denoted S1' and S3' in FIG. 11. The rewriting operation in the second embodiment will now be described with particular attention to these new and modified steps.

Step S1': The value P in the address pointer 14 is incremented, and the duplication detection flag DUPF in the RAM 2 is reset to "0".

Step S2: The address latch 13 is checked to see whether any rewrite address already stored therein matches the current rewrite address. If so, step S3' is carried out next. If not, step S5 is carried out next.

Step S3': In the RAM 2, the duplication detection flag DUPF is set to "1", and the sector number of the buffer sector having the duplicate rewrite address is written in variable P2.

Steps S4 to S7 are the same as in the first embodiment.

Step S10: The duplication detection flag DUPF is checked. If DUPF is set to "1", indicating that a duplicate address was found in step S2, step S11 is carried out next. Otherwise, step S8 is carried out next.

Step S11: The duplication flag (bit 9) in the management area of buffer sector BUF[P2] is set to "1".

Step S8 and the subsequent steps are the same as in the first embodiment.

In the rewriting operation of the second embodiment, if a duplicate rewrite address is found, as soon as the new data have been written in the current buffer sector, but not before, the older data having the duplicate rewrite address are flagged as invalid by setting the duplication flag in the corresponding buffer sector. The second embodiment normally produces the same effects as the first embodiment, and also makes it possible to restore valid data even if power fails or is shut down during a rewriting operation.

Third Embodiment

The microcomputer in the third embodiment of the present invention differs from the microcomputer in the first embodiment in the configuration and function of the flash memory unit 1 in FIG. 1.

Figure 12:
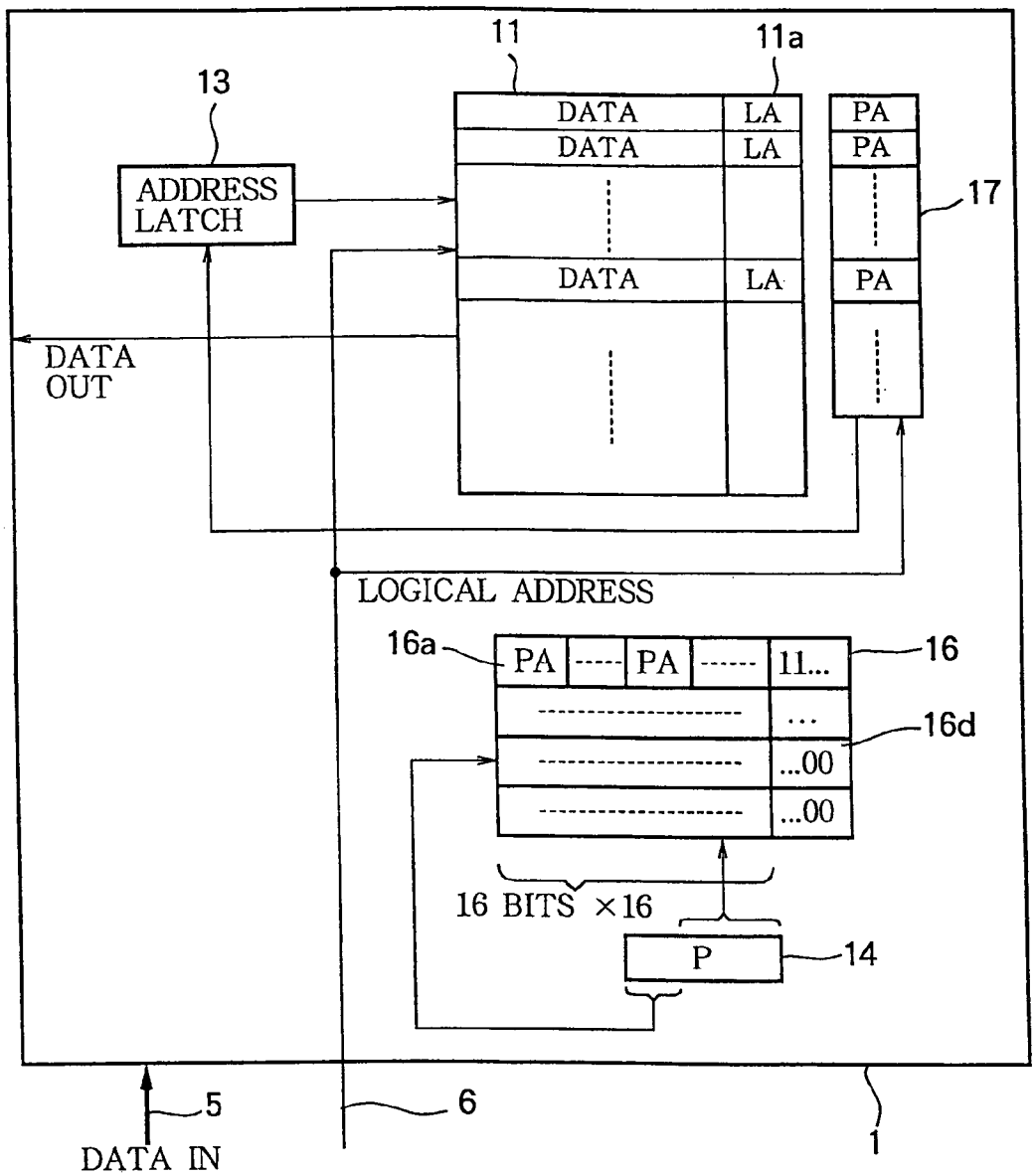
FIG. 12 is a functional bock diagram of the flash memory unit in a third embodiment.

FIG. 12 is a functional bock diagram of the flash memory unit 1 in the microcomputer in the third embodiment. The flash memory now includes a flash data memory 11 and an erase buffer 16. The flash memory unit 1 also includes an address latch 13, an address pointer 14, and an address RAM 17. The erase buffer 16 and address RAM 17 replace the flash buffer 12 and read access redirection circuit 15 of the first embodiment. The flash data memory 11, address latch 13, and address pointer 14 are equivalent to the corresponding elements in FIG. 2, but are modified with respect to structure and function.

The flash data memory 11 in the third embodiment has two hundred eighty-eight 34-byte data sectors. Each data sector comprises a 32-byte data area for storing data, and a 2-byte memory management area 11a for storing a logical sector address (LA). Write access is carried out a word (2 bytes) at a time; erasure can be carried out on one or multiple sectors at a time.

Figure 13:
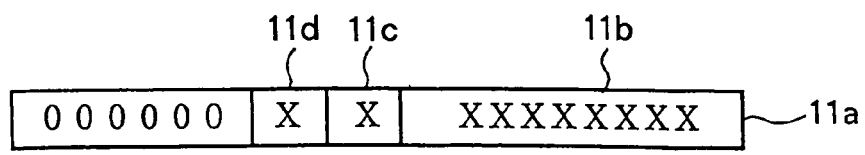
FIG. 13 shows the bit configuration of a memory management area in FIG. 12.

FIG. 13 shows the bit configuration of the memory management area 11a. The two bytes of the memory management area 11a comprise an 8-bit logical sector address area 11b (bits 7 to 0), a 1-bit valid sector flag 11c (bit 8), a 1-bit bad sector flag 11d (bit 9), and a 6-bit dummy data area (bits 15 to 10). The dummy data area is always cleared to "000000".

The valid sector flag 11c indicates whether the data stored in the data area of the data sector are valid. The bad sector flag 11d indicates whether a write error has occurred in the data sector.

The erase buffer 16 comprises four 34-byte buffer sectors, each including sixteen 2-byte buffer data areas 16a and a 2-byte buffer management area 16d. The buffer data areas 16a store the physical sector addresses (PA) of data sectors that are currently being erased. Write access to the erase buffer 16 is carried out a word at a time; erasure can be carried out on one or multiple sectors at a time.

Figure 14:
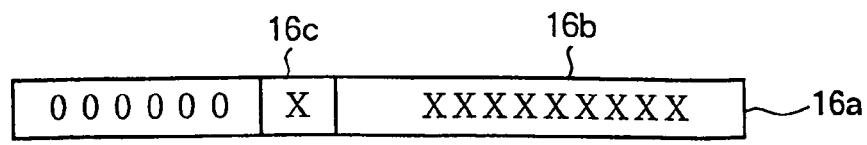
FIG. 14 shows the bit configuration of a buffer data area in FIG. 12.

FIG. 14 shows the bit configuration of the buffer data areas 16a. Each of the sixteen 2-byte buffer data areas 16a provided in each buffer sector comprises a 9-bit physical sector address area 16b (bits 8 to 0), a 1-bit write completion flag 16c (bit 9), and a 6-bit dummy data area (bits 15 to 10). The dummy data area is always cleared to "000000".

The physical sector address area 16b stores the physical address of a data sector in the flash data memory 11. The write completion flag 16c indicates whether this data sector has been written to following its last erasure.

Each time information is written in a buffer data area 16a, the corresponding bit in the buffer management area 16d of the same buffer sector is set to "1". The buffer data areas 16a are used in ascending order, so the bits in the buffer management area 16d are set to "1" in ascending order. The positions of the buffer data areas 16a in which information has already been written and the position of the buffer data area 16a to be written to next can therefore be identified from the buffer management area 16d.

When an erasing process is carried out in the flash data memory 11, normally sixteen data sectors and one buffer sector are erased simultaneously.

The address pointer 14 in the third embodiment is a 6-bit counter. The two high-order bits (bits 5 and 4) indicate one of the four buffer sectors in the erase buffer 16; the four low-order bits (bits 3 to 0) indicate a buffer data area 16a in that buffer sector.

The address RAM 17 functions as an address management memory and is divided into address management areas that are accessed according to logical sector addresses. Each address management area stores the physical sector address (PA) of the data sector currently assigned to the corresponding logical sector address.

The flash data memory unit 1 in the third embodiment has a specified capacity of 8 kbytes, which is divided into two hundred fifty-six 32-byte logical sectors. Each logical sector is identified by an 8-bit logical sector address. A physical sector address is a fixed address that identifies a (physical) data sector in the flash data memory 11. Since the flash data memory 11 has two hundred eighty-eight data sectors, 9-bit physical sector addresses are used. The two hundred fifty-six logical sector addresses are assigned to two hundred fifty-six of the two hundred eighty-eight data sectors; these two hundred fifty-six data sectors vary as the contents of the RAM 17 are updated.

The address latch 13 in the third embodiment is a 9-bit register that stores a physical sector address read from the address RAM 17. This physical sector address is used to read data from the flash data memory 11.

As the flash data memory 11 includes two hundred eighty-eight data sectors, it has thirty-two extra sectors in excess of its specified data capacity of 8 kbytes. Since only sixteen data sectors are erased simultaneously, sixteen of the thirty-two extra sectors are left available to replace bad sectors.

In the third embodiment, new data to be written at a logical sector address currently assigned to a first data sector are instead written in a second data sector; the logical sector address is reassigned to the second data sector; then the first data sector is erased by sixteen erasing processes, each carried out in a different rewriting operation, each lasting for a time U shorter than the time T necessary for complete erasure and equal to or greater than 1/16 of the complete erasure time T.

In the rewriting operation in the third embodiment, an application program in the application ROM 3b calls a rewriting subroutine (rewrite control program) from the control ROM 3a, and the control unit 4 controls the operation in accordance with the rewriting subroutine, as in the first embodiment. The rewriting operation in the third embodiment will now be described in further detail.

Figure 15A:
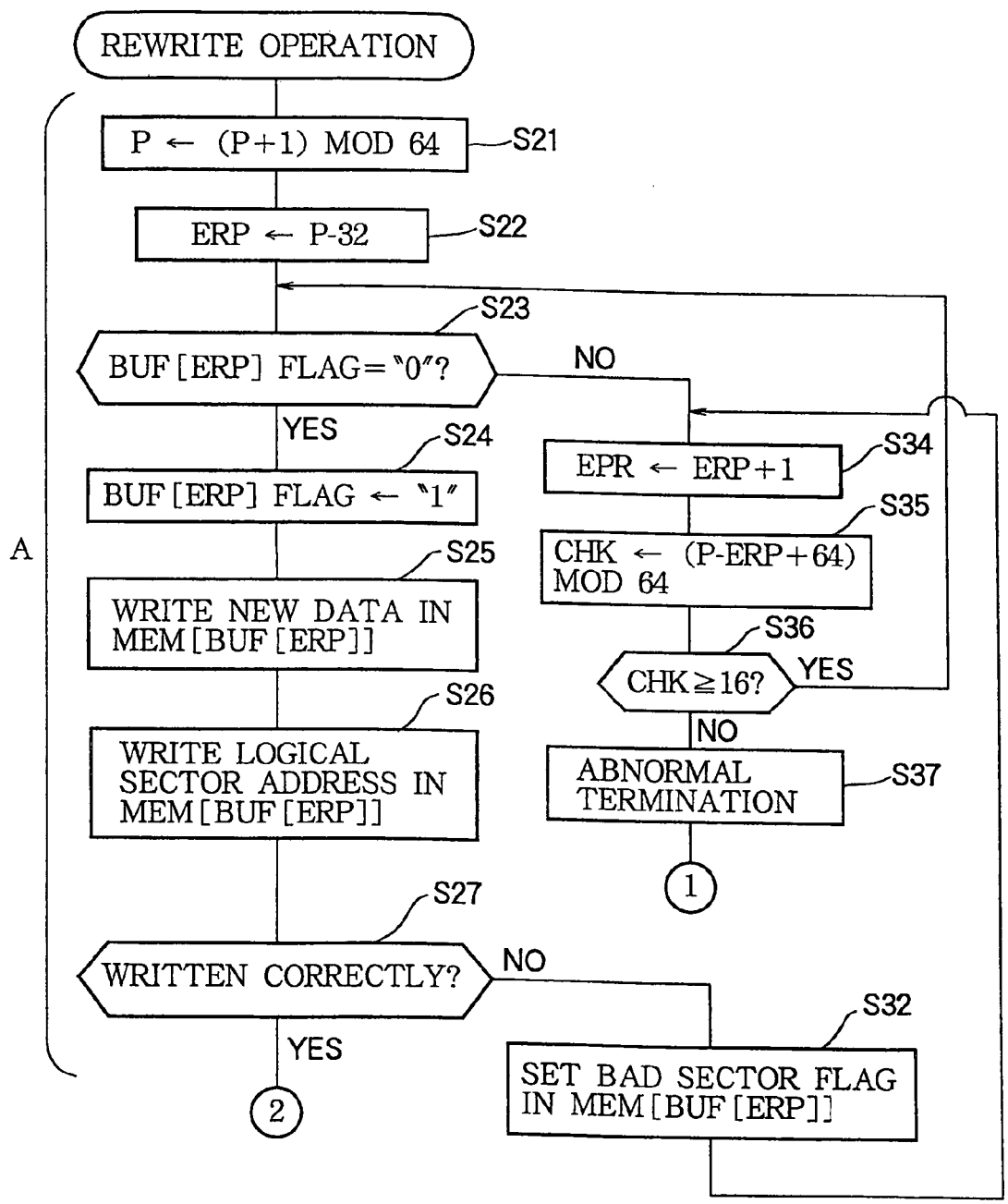
FIGS. 15A and 15B are a flowchart illustrating the rewriting operation in the third embodiment.
Figure 15B:
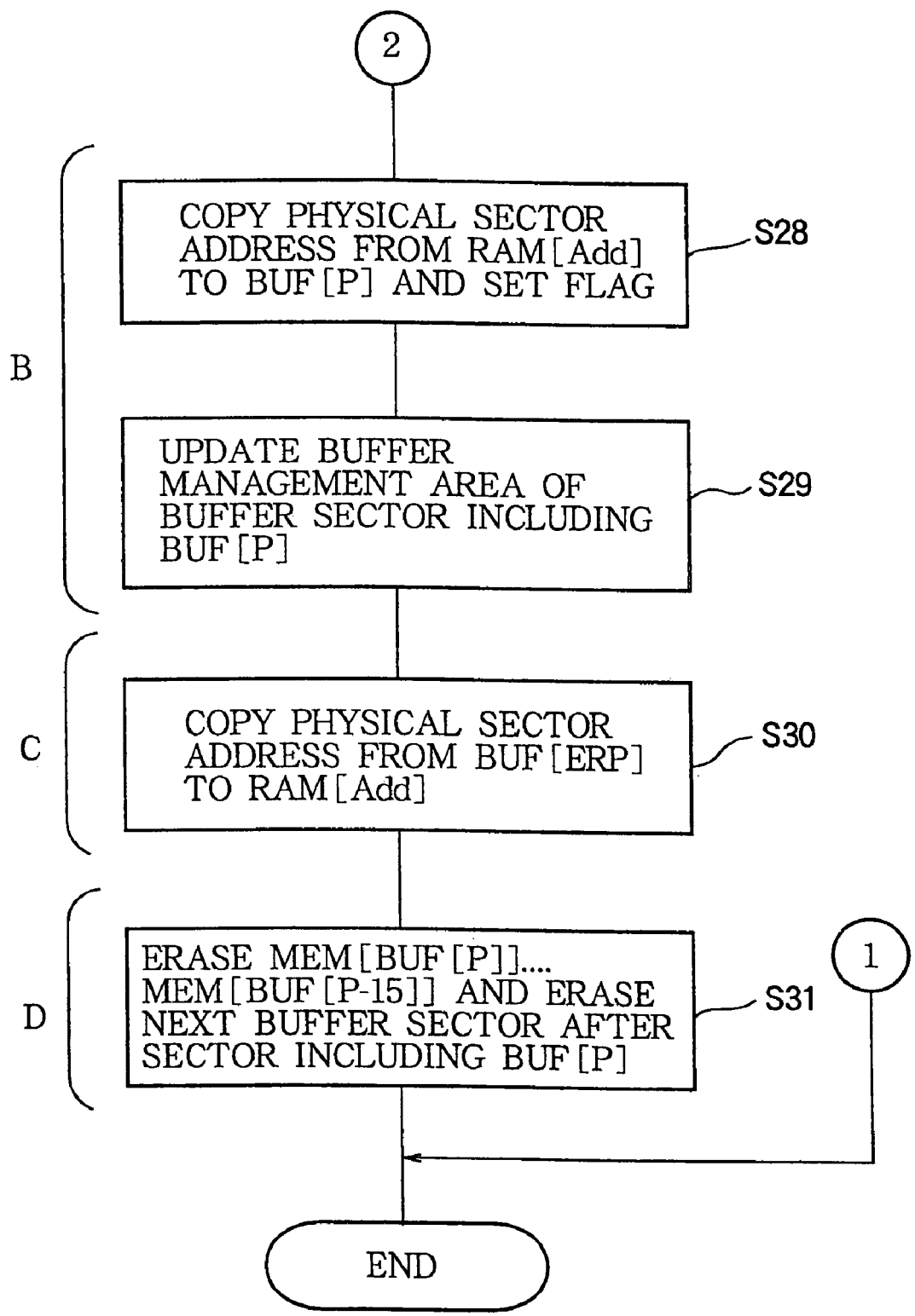

FIGS. 15A and 15B illustrate the rewriting operation in the third embodiment of the invention in flowchart form. In this drawing and the following description, "0" means that the corresponding memory cell of the flash data memory 11 or erase buffer 16 has been erased, and "1" means that the corresponding memory cell has been programmed.

P represents the value in the address pointer 14. ERP and CHK are variables located in the RAM 2. Add is the logical sector address of new data to be written in the flash memory unit 1, replacing data already stored therein with the same logical sector address.

BUF[P] is a buffer data area indicated by the pointer P. BUF[ERP] is a buffer data area indicated by the variable ERP. BUF[P−15] is a buffer data area indicated by P−15. Because the sixty-four buffer data areas are used cyclically, P−15 is actually obtained as the remainder left after dividing P+49 by 64, which can be expressed as follows.

(P+49) mod 64

MEM[BUF[ERP]] represents the data sector having the physical sector address stored in bits 8 to 0 in buffer data area BUF[ERP].

RAM[Add] represents the address management area located at address Add in the address RAM 17.

The rewriting operation can be divided into four major parts. In part A, illustrated in FIG. 15A, a good erased data sector is found in the flash data memory 11, and the new data and logical address are written in this data sector. In parts B, C, and D, illustrated in FIG. 15B, the erase buffer 16 is updated, then the address RAM 17 is updated, and finally sixteen data sectors and one buffer sector are erased.

The individual steps in the rewriting operation are carried out as described below.

Step S21 (FIG. 15A): The address pointer 14 (P) is incremented by 1. Because the sixty-four buffer data areas are used cyclically, pointer P is actually updated to the remainder left when P+1 is divided by 64, which can be expressed as follows.

(P+1) mod 64

Step S22: The value P−32 is written in the variable ERP in the RAM 2. This value is actually the remainder left when P+32 is divided by 64, which can be expressed as follows.

(P+32) mod 64

Step S23: The write completion flag in bit 9 of buffer data area BUF[ERP] is checked. If this write completion flag is "0", step S24 is carried out next. Otherwise, step S34 is carried out next.

Step S24: The write completion flag in buffer data area BUF[ERP] is set to "1".

Step S25: The new data are written in the data area of data sector MEM[BUF[ERP]] a word at a time.

Step S26: The logical address Add is written in bits 7 to 0 of the memory management area 11a of data sector MEM[BUF[ERP]] and the valid sector flag (bit 8) in this memory management area is simultaneously set to "1".

Step S27: Data sector MEM[BUF[ERP]] is read to check that the new data and management information were stored correctly. If they were, step S28 is carried out next. Otherwise, step S32 is carried out next.

Step S28 (FIG. 15B): Address management area RAM[Add] is read to obtain the physical sector address of the data sector containing the old data replaced by the new data, and this physical sector address is written in bits 8 to 0 of buffer data area BUF[P].

Step S29: The buffer management area 16d of the buffer sector including buffer data area BUF[P] is updated by setting the bit corresponding to buffer data area BUF[P] to "1".

Step S30: The physical sector address (bits 8 to 0 of BUF[ERP]) of the data sector now storing the new data is written in address management area RAM[Add].

Step S31: An erasing process is carried out simultaneously on sixteen data sectors having the physical sector addresses written in buffer data areas BUF[P] to BUF[P−15] and on the buffer sector following the sector containing buffer data area BUF[P].

Step S32 (FIG. 15A): If the read check in step S27 failed, the bad sector flag in the memory management area 11a of data sector MEM[BUF[ERP]] is set to "1".

Step S34: If the write completion flag checked in step S23 was set to "1", or if the read check in step S27 failed and a bad sector flag was set in step S32, the variable ERP is incremented by one. Because the sixty-four buffer data areas are used cyclically, ERP is actually updated to the remainder left when ERP+1 is divided by 64, which can be expressed as follows.

(ERP+1) mod 64

Step S35: The value of the variable ERP updated in step S34 is subtracted from the pointer value P updated in step S21 and the result is written in the variable CHK. Actually, CHK is updated to the remainder left when P+64−ERP is divided by 64, which can be expressed as follows.

(P+64−ERP) mod 64

Step S36: The variable CHK is checked. If CHK is 16 or greater, step S23 is carried out next. Otherwise, step S37 is carried out next.

Step S37: Abnormal termination processing is performed, and the rewriting operation ends.

FIGS. 16 to 19 illustrate parts A to D of the rewriting operation under the following assumptions.

Before the rewriting operation starts, old data Data1 are stored in a data sector having physical sector address P-Add1 and logical sector address Add. The physical sector address P-Add1 is therefore written in data area Add of the address RAM 17. The thirty-two buffer data areas in the erase buffer 16 indicated by pointer values "000000", "000001", . . . , "011111" contain physical sector addresses E-Add1 to E-Add32. The address pointer 14 is set to "011111", indicating the last of these buffer data areas. The erasure of the seventeen data sectors having physical sector addresses E-Add1 to E-Add17 has already been completed. Fifteen erasing processes have been carried out on the data sector having physical sector address E-Add18. A single erasing process has been carried out on a data sector having physical sector address E-Add32. The new data Data2 to be stored in the rewriting operation have the same logical sector address Add as Data1, and will replace Data1.

On these assumptions, the rewriting operation illustrated in FIGS. 15A and 15B will now be described with reference to FIGS. 16 to 19.

In step S21, the value of pointer P before the update indicated a buffer data area giving the physical address of a data sector that was partially erased in the preceding rewriting operation. The updated pointer P indicates a buffer data area that is currently empty, and will be used to store the physical address of a data sector that will begin to be erased in the current rewriting operation.

In the illustrated example, pointer P is updated from "011111" (31 in decimal notation) to "100000" (32 in decimal notation). The old pointer value "011111" indicated the buffer data area storing the physical address E-add32 of the data sector that had been partially erased only once. The new pointer value "100000" indicates a buffer data area in which the physical address P-Add1 of the data sector currently storing Data1 will be written.

The flash data memory 11 in the third embodiment has thirty-two extra sectors in excess of the specified data capacity of 8 kbytes. Fifteen of the extra sectors are currently in various stages of erasure. Depending on the number of bad sectors found so far, from one to seventeen of the other extra sectors have been fully erased and are available for storing the new data (Data2). The variable ERP is set in step S22 (if no bad sector has been found) or step S34 (of one to sixteen bad sectors have been found) to indicate the first buffer data area storing the physical sector address of one of these fully erased data sectors. By the assumptions above, there are no bad sectors and this first buffer data area is the thirty-second buffer data area preceding buffer data area BUF[P], indicated by the value written in the variable ERP in step S22. This value (P−32) is calculated as follows.

$$ERP=(32+32) \bmod 64=0$$

The variable ERP is therefore set to "0", indicating the buffer data area storing physical address E-Add1. The new data (Data2) are written in the data sector with this physical address in step S25, and the logical address Add is written in the same data sector in step S26. Because data are written a word at a time, seventeen writing processes are carried out in steps S25 and S26. If it takes 20 μs to write one word, these writing processes are completed in 340 μs.

Figure 16:
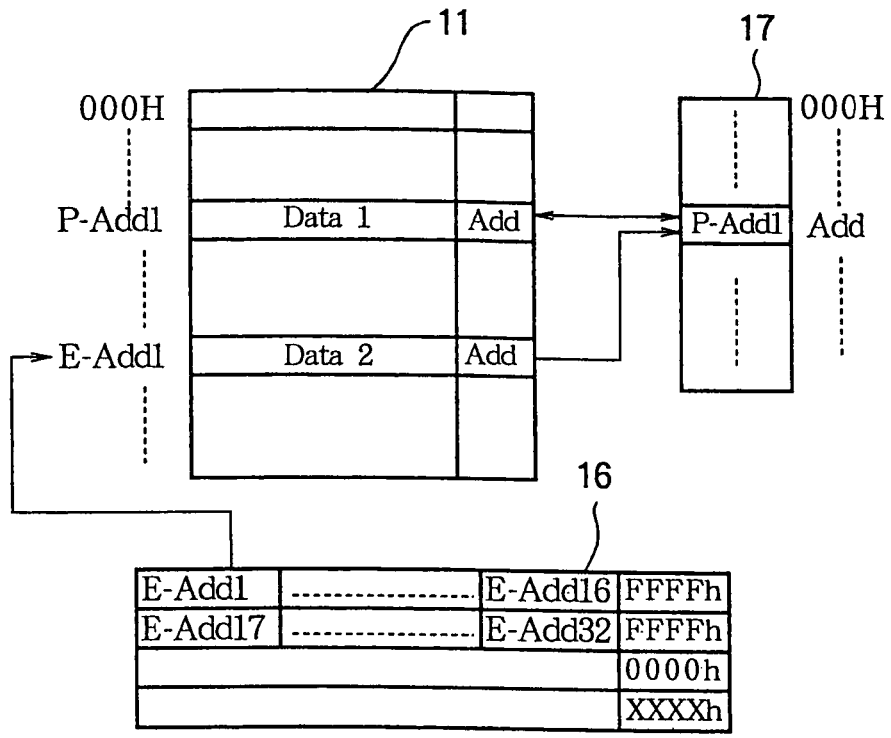
FIG. 16 shows an example of the state of the flash data memory, erase buffer, and address RAM in FIG. 12 after steps S21 to S27 in FIG. 15A.

FIG. 16 shows the state after part A of the rewriting operation (steps S21 to S27), on the assumption that the read-after-write check in step S27 passes. The new data Data2 are stored in the data area of the data sector having physical sector address E-Add1. The logical address Add has been written in the memory management area of this data sector and the valid sector flag (not visible) in this memory management area has been set to "1". The address RAM 17 still stores the physical sector address P-Add1 of the old data (Data1) in the address management area RAM[Add] corresponding to logical address Add.

Figure 17:
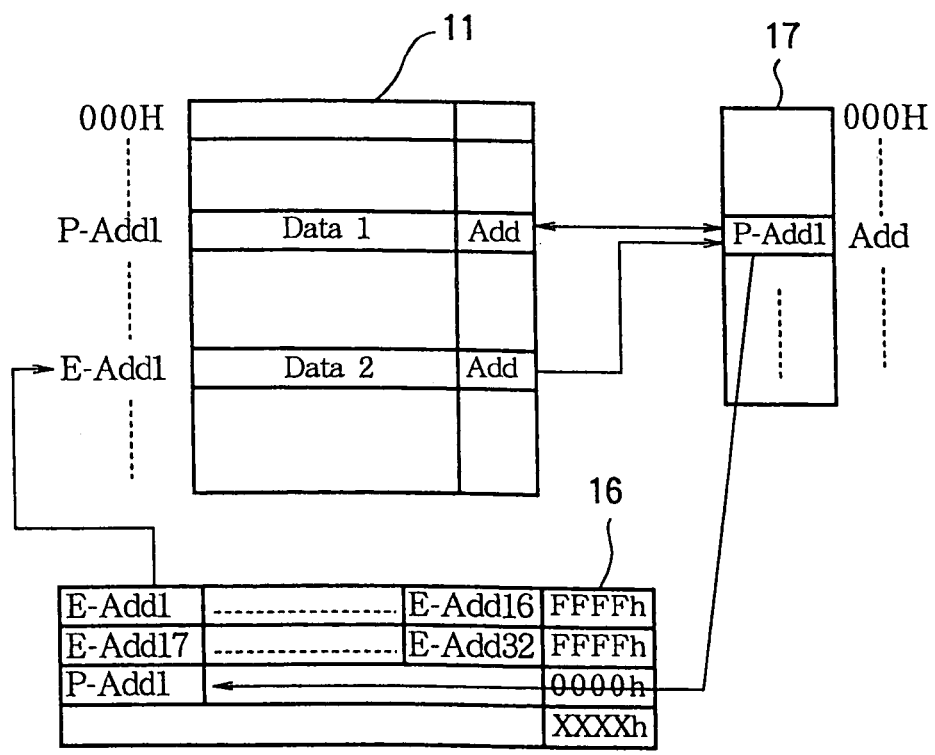
FIG. 17 shows an example of the state of the flash data memory, erase buffer, and address RAM in FIG. 12 after steps S28 and S29 in FIG. 15B.

FIG. 17 illustrates the state following part B of the rewriting operation (steps S28 and S29). The physical sector address P-Add1 has been copied from the address management area RAM[Add] into the buffer data area pointed at by the updated address pointer value "100000". The buffer management area 16d of the buffer sector including this buffer data area has been updated from "0000000000000000" to "0000000000000001".

Figure 18:
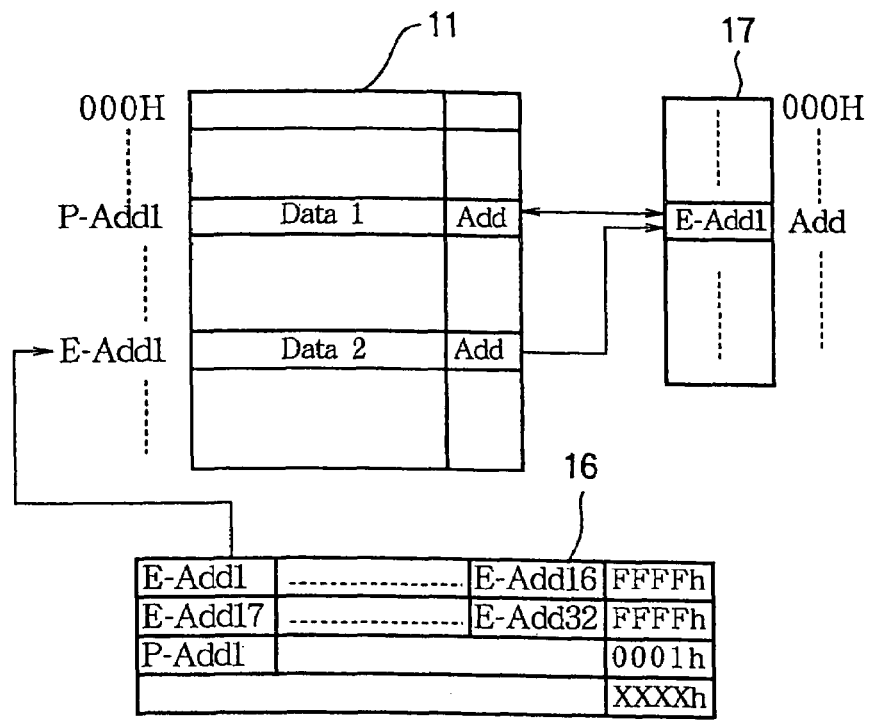
FIG. 18 shows an example of the state of the flash data memory, erase buffer, and address RAM in FIG. 12 after step S30 in FIG. 15B.

FIG. 18 illustrates the state following part C of the rewriting operation (step S30). Address management area RAM[Add] of the address RAM 17 has been updated to indicate the physical sector address E-Add1 of the data sector storing the new data Data2.

Figure 19:
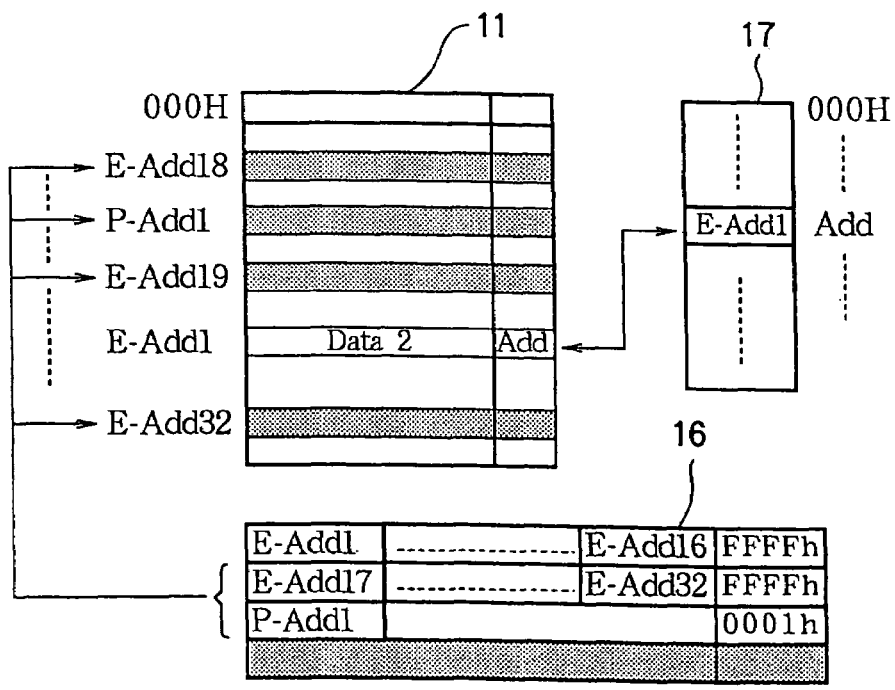
FIG. 19 shows an example of the state of the flash data memory, erase buffer, and address RAM in FIG. 12 after step S31 in FIG. 15B.

FIG. 19 illustrates the state following part D of the rewriting operation (step S31). An erasing process has been carried out simultaneously on the sixteen data sectors having physical sector addresses E-Add18 to E-Add32 and P-Add1, and on the single buffer data sector following the buffer sector including the buffer data area containing physical sector address P-Add1. The sixteen data sectors are selected by decoding their physical addresses; the buffer sector is selected by decoding the high-order two bits of the address pointer. The decoding is carried out by a decoder (not shown) in the flash data memory 11.

As in the first and second embodiments, each sector is erased by sixteen erasing processes, which are carried out in sixteen consecutive rewriting operations. Accordingly, the erasure time in step 31 can be approximately 1/16 of the conventional erasure time. If it takes 20 ms to erase a sector completely, the erasure time in step 31 may be approximately 1.25 ms.

When step S31 ends, a single rewriting operation has been completed. If a word write operation takes 20 μs and software processing time is excluded, steps S21 to S27 take 340 μs; steps S28 and S29, in which two word write operations are performed, take 40 μs; step S30, which involves a RAM write access, takes several tens or hundreds of nanoseconds; step 31 takes 1.25 ms. If the very short writing time in step S30 is ignored, the time required for the single rewriting operation is calculated as follows:

$$0.34+0.04+1.25=1.63 \text{ ms}$$

If the read-after-write check in step S27 fails, the bad sector flag is set to "1" in the data sector with physical address E-Add1 (step S32), and the variable ERP is incremented step (S34). In the example shown in FIG. 16, ERP is updated to $$(ERP+1) \bmod 64=1$$

The variable ERP now indicates the buffer data area containing physical address E-Add2. The rewriting operation can still be carried out if the data sector with this physical address has been fully erased, as indicated by the difference between P and ERP. This difference is assigned to the variable CHK in step S35. The valid range of the variable CHK, tested in step S36, is:

$$16 \leq CHK \leq 32$$

In the present example, after ERP is incremented from 0 to 1, CHK is equal to 31, which is within the valid range, so the operation returns to step S23, the new data (Data2) and logical address (Add) are written in the data sector with physical address E-Add2, the valid sector flag in this data sector is set to "1", and another read-after-write check is carried out.

If this read-after-write check also fails, the process again loops through step S32 and steps S34-S37 back to step S23, ERP being incremented from 1 to 2, making CHK equal to 30, and an attempt is made to write the new data (Data2) in the data sector having physical sector address E-Add2.

This loop continues until the read-after-write check passes, as long as CHK remains equal to or greater than sixteen. The number of remaining data sectors available for storing the new data is CHK minus fifteen (CHK−15).

Each time a write error occurs, the recovery process in steps S34 to S37 replaces the bad data sector with another data sector. Up to sixteen bad data sectors can be replaced. When a write error occurs, the physical sector address of the bad data sector is not written in the erase buffer 16 or address RAM 17, so the bad data sector will not be erased or used thereafter. Setting the bad sector flag in step S32 ensures that the bad sector will not be erased or used after the next power-on.

The data reading process in the third embodiment will be described next. First, the address RAM 17 is accessed at a logical read sector address comprising the eight high-order bits on the 13-bit logical read address. The 9-bit physical sector address read from the location in the address RAM 17 specified by this logical address is written in the address latch 13. Next, the word indicated by the physical sector address stored in the address latch 13 and the four low-order bits of the 13-bit logical read address is read from the flash data memory 11.

The third embodiment requires initialization of the address pointer 14 and address RAM 17 at power-on. The initialization operation will now be described.

At power-on, the memory management areas 11a of the flash data memory 11 are checked in succession. If the valid sector flag of a data sector is set to "1" and the bad sector flag is cleared to "0", the physical sector address of the data sector is written in the address RAM 17 at the location specified by the logical sector address stored in the memory management area 11a.

The buffer management areas 16d in the erase buffer 16 are also checked successively to find the buffer data area written to in the last preceding rewriting operation. This buffer data area can easily be found by checking the bits of each buffer management area 16d in ascending order of bit position. The address pointer 14 is set to the number of consecutive "1" bits following the first "1" bit.

Like the initialization operation in the first embodiment, this initialization operation can be provided as a subroutine in the control ROM 3a. An application program in the application ROM 3b can call the initialization subroutine in the control ROM 3a, and the control unit 4 can control the initialization operation according to the initialization subroutine.

In the third embodiment, as in the first and second embodiments, when data stored in a first data sector are replaced with new data, the new data are written in a second sector that has already been erased; then the first data sector is erased. The erasing takes place in sixteen erasing processes, each of which is carried out in a different rewriting operation. Each erasing process lasts for a time U shorter than the time T necessary for complete erasure. Accordingly, each rewriting operation can be completed in a reduced time.

Because the address RAM 17 manages the relationships between physical sector addresses and logical sector addresses in the third embodiment, a rewriting operation does not require the step of moving temporarily stored data from a buffer sector to a data sector. Accordingly, the time required to complete a single rewriting operation in the third embodiment is usually shorter than in the first or second embodiment.

Physical/logical sector address management by the address RAM 17 also enables a succession of new data apparently destined for the same data sector (the same logical sector address) to be successively written in different data sectors. This scheme enhances the reliability of the flash memory.

The reliability of the flash memory is further enhanced because all erased data sectors are available for recovery from write errors.

The address RAM 17 and address latch 13 enable data to be read by converting a logical read sector address into physical sector address. Application programs do not have to deal with the difference between logical and physical sector addresses, so the data read time can be reduced.

As in the first and second embodiments, backup power for a long erasing process is not necessary, because a sector is erased in several comparatively short erasing processes.

The preceding embodiments can be modified in various ways. For example, the processing of duplicate addresses in the first and second embodiments can be modified to ensure that the relevant data sector is not erased more than sixteen times. One way to do this is to provide the address latch 13 with do-not-erase flags as well as validity flags.

Alternatively, the duplication flags in the first or second embodiment can be eliminated and duplication can be inferred from the addresses and validity flags. If the flash memory unit 1 is accessed in such a way that duplication does not occur, the step of checking for duplicate addresses can be eliminated entirely.

The sector pointers in the first and second embodiments can be eliminated and the address pointer can be initialized on the basis of the validity flags at power-on. Alternatively, the validity flags in the buffer sectors can be eliminated, as validity is also indicated by the sector pointers.

The number of buffer sectors in the first or second embodiment may be increased to provide spare sectors for replacement of bad buffer sectors, or to reduce the frequency with which each buffer sector is accessed.

In a variation of the third embodiment, the recovery process is eliminated from the rewriting operation. This makes it possible to reduce the size of the flash data memory 11 by sixteen sectors and to reduce the size of the erase buffer 16 by one sector.

In another variation of the third embodiment, the valid sector flag in the data sector to which the logical address of the new data is currently assigned is checked to determine whether the data sector currently stores valid data. If not, the new data are written directly into that data sector, and no sectors are erased. This variation requires storing default addresses in unoccupied address management areas in the address RAM 17 at power-on.

The flash data memory 11 and erase buffer 16 in the third embodiment have been described as separate flash memory devices, but the two can be combined into a single flash memory.

The flash data memory 11 in the third embodiment has thirty-two data sectors in excess of its specified data capacity, but the number of extra data sectors may be increased. If there are more data sectors, the number of rewriting operations carried out on a single data sector can be reduced, improving the reliability of the flash memory. More data sectors are also available for recovery from write errors.

The erase buffer 16 in the third embodiment has four buffer sectors, but the number of buffer sectors may be increased.

In the third embodiment, in each rewriting operation, the variable ERP is obtained from the address pointer 14 and the write completion flags in the buffer data areas 16a. In a variation of the third embodiment, the ERP value is obtained in this way at power-on and then incremented at each successive rewriting operation.

The address pointer 14 in the first to third embodiments can be a variable in the RAM 2.

In the first to third embodiments, a sector is erased by sixteen separate erasing processes, but the number of erasing processes can be changed to any number N equal to or greater than two. As N increases, the apparent rewriting time is reduced.

In the above descriptions of the first to third embodiments, "0" represents the erased state and "1" represents the programmed or written state, but these meanings can be reversed.

The invention can thus be practiced in any data storage apparatus having the following features, of which feature 1 is necessary and features 2-7 are preferred.

1. The data storage apparatus comprises:
   a flash memory divided into sectors, each sector being completely erasable in a time T; and
   a control unit that stores new data in the flash memory by executing a rewriting operation including erasing at least N sectors simultaneously for a time U less than the time T, where N is an integer greater than one, and writing the new data in a sector that has been erased N times, each time for the time U, and is now fully erased.

2. The new data replace data stored in one of the at least N sectors erased in the rewriting operation, in which case,
3. The control unit erases said one of the at least N sectors during N consecutive rewriting operations.
4. The sectors in the flash memory include 2N buffer sectors and a plurality of data sectors, the new data being written in one of the 2N buffer sectors, the 2N buffer sectors including respective areas for storing addresses of the data sectors, the rewriting operation also including transferring data from another one of the 2N buffer sectors to one of the data sectors, in which case,
5. The data storage apparatus further comprises:
   an address latch for storing the addresses of the data sectors to be erased in the rewriting operation; and
   a read access redirection circuit for directing read access to the data sectors or the buffer sectors according to the addresses stored in the address latch.
6. The sectors have physical addresses and the new data have a logical address, further comprising an address management memory with a plurality of areas for storing the physical addresses of a plurality of the sectors, the physical address of the sector in which the new data are written being stored in an area corresponding to the logical address, in which case,
7. The control unit uses at least two of the sectors in the flash memory as an erase buffer for storing the physical addresses of sectors being erased and the physical addresses of sectors that have been fully erased and are available for storing the new data.

Those skilled in the art will recognize that further variations are possible within the scope of the invention, which is defined by the appended claims.

What is claimed is:

1. A data storage apparatus, comprising:
   a flash memory divided into sectors, each sector being completely erasable in a time T; and
   a control unit that stores new data in the flash memory by executing a rewriting operation including erasing at least N sectors simultaneously for a time U less than the time T, where N is an integer greater than one, and writing the new data in a sector that has been erased N times, each time for the time U, and is now fully erased.

2. The data storage apparatus of claim 1, wherein the new data replace data stored in one of the at least N sectors erased in the rewriting operation.

3. The data storage apparatus of claim 2, wherein the control unit erases said one of the at least N sectors during N consecutive rewriting operations.

4. The data storage apparatus of claim 1, wherein the sectors in the flash memory include 2N buffer sectors and a plurality of data sectors, the new data being written in one of the 2N buffer sectors, the 2N buffer sectors including respective areas for storing addresses of the data sectors, the rewriting operation also including transferring data from another one of the 2N buffer sectors to one of the data sectors.

5. The data storage apparatus of claim 4, further comprising:
   an address latch for storing the addresses of the data sectors to be erased in the rewriting operation; and
   a read access redirection circuit for directing read access to the data sectors or the buffer sectors according to the addresses stored in the address latch.

6. The data storage apparatus of claim 1, wherein the sectors have physical addresses and the new data have a logical address, further comprising an address management memory with a plurality of areas for storing the physical addresses of a plurality of the sectors, the physical address of the sector in which the new data are written being stored in an area corresponding to the logical address.

7. The data storage apparatus of claim 6, wherein the control unit uses at least two of the sectors in the flash memory as an erase buffer for storing the physical addresses of sectors being erased and the physical addresses of sectors that have been fully erased and are available for storing the new data.

* * * * *